(12) United States Patent
Tokunaga

(10) Patent No.: US 8,476,632 B2
(45) Date of Patent: Jul. 2, 2013

(54) SEMICONDUCTOR DEVICE AND MANUFACTURING METHOD THEREOF

(75) Inventor: Hajime Tokunaga, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1603 days.

(21) Appl. No.: 11/643,941

(22) Filed: Dec. 22, 2006

(65) Prior Publication Data

US 2007/0170505 A1    Jul. 26, 2007

(30) Foreign Application Priority Data

Dec. 27, 2005    (JP) .................................. 2005-376697

(51) Int. Cl.
*H01L 29/04* (2006.01)

(52) U.S. Cl.
USPC ........ 257/59; 257/72; 257/E33.056; 349/149; 349/151

(58) Field of Classification Search
USPC ....... 257/59, 72, 629, E33.056; 349/149–152
See application file for complete search history.

(56) References Cited

U.S. PATENT DOCUMENTS

| | | | |
|---|---|---|---|
| 6,316,787 B1 | 11/2001 | Ohtani | |
| 6,498,369 B1 | 12/2002 | Yamazaki et al. | |
| 6,509,217 B1 | 1/2003 | Reddy | |
| 6,646,288 B2 | 11/2003 | Yamazaki et al. | |
| 6,657,228 B2 | 12/2003 | Ohtani | |
| 6,882,012 B2 | 4/2005 | Yamazaki et al. | |
| 6,972,435 B2 | 12/2005 | Ohtani | |
| 6,979,841 B2 | 12/2005 | Ohtani | |
| 7,006,846 B2 | 2/2006 | Stratmoen et al. | |
| 7,015,826 B1 | 3/2006 | Chan et al. | |
| 7,061,380 B1 | 6/2006 | Orlando et al. | |

(Continued)

FOREIGN PATENT DOCUMENTS

| | | |
|---|---|---|
| EP | 1 045 447 | 10/2000 |
| EP | 1437683 A | 7/2004 |

(Continued)

OTHER PUBLICATIONS

International Search Report (Application No. PCT/JP2006/325990) Dated Apr. 17, 2007.

(Continued)

*Primary Examiner* — Matthew E Warren
(74) *Attorney, Agent, or Firm* — Eric J. Robinson; Robinson Intellectual Property Law Office, P.C.

(57) ABSTRACT

To provide a wireless identification semiconductor device provided with a display function, which is capable of effectively utilizing electric power supplied by an electromagnetic wave. The following are included: an antenna; a power source generating circuit electrically connected to the antenna; an IC chip circuit and a display element electrically connected to the power source generating circuit; a first TFT provided in the power source generating circuit; a second TFT provided in the IC chip circuit; a third TFT provided in the display element; an insulating film provided to cover the first to third TFTs; a first source electrode and a first drain electrode, a second source electrode and a second drain electrode, and a third source electrode and a third drain electrode which are formed over the insulating film; and a pixel electrode electrically connected to the third source electrode or the third drain electrode. The first source electrode or the first drain electrode is electrically connected to the antenna.

20 Claims, 17 Drawing Sheets

U.S. PATENT DOCUMENTS

| | | |
|---|---|---|
| 7,148,803 B2 | 12/2006 | Bandy et al. |
| 7,374,983 B2 * | 5/2008 | Okamoto ............... 438/163 |
| 7,414,288 B2 | 8/2008 | Ohtani |
| 7,518,692 B2 | 4/2009 | Yamazaki et al. |
| 7,579,214 B2 | 8/2009 | Yamazaki et al. |
| 7,582,904 B2 * | 9/2009 | Fujii et al. ................. 257/72 |
| 2002/0158829 A1 * | 10/2002 | Yamazaki et al. ........... 345/92 |
| 2003/0052336 A1 | 3/2003 | Yamazaki et al. |
| 2005/0133605 A1 | 6/2005 | Koyama et al. |
| 2005/0194645 A1 | 9/2005 | Yamaguchi et al. |
| 2006/0209055 A1 * | 9/2006 | Wakita .................. 345/204 |
| 2008/0290345 A1 | 11/2008 | Ohtani |

FOREIGN PATENT DOCUMENTS

| | | |
|---|---|---|
| JP | 2000-356788 | 12/2000 |
| JP | 2001-330860 A | 11/2001 |
| JP | 2003-044808 | 2/2003 |
| JP | 2003-223622 | 8/2003 |
| JP | 2004-220591 A | 8/2004 |
| JP | 2004-266295 A | 9/2004 |
| JP | 2005-183741 | 7/2005 |
| JP | 2005-202943 | 7/2005 |
| JP | 2005-285109 | 10/2005 |
| JP | 2005-294814 | 10/2005 |
| JP | 2007-200291 A | 8/2007 |
| KR | 2000-0006024 | 1/2000 |
| WO | 2005/086088 | 9/2005 |
| WO | WO-2007/077850 | 7/2007 |

OTHER PUBLICATIONS

Written Opinion (Application No. PCT/JP2006/325990) Dated Apr. 17, 2007.

* cited by examiner

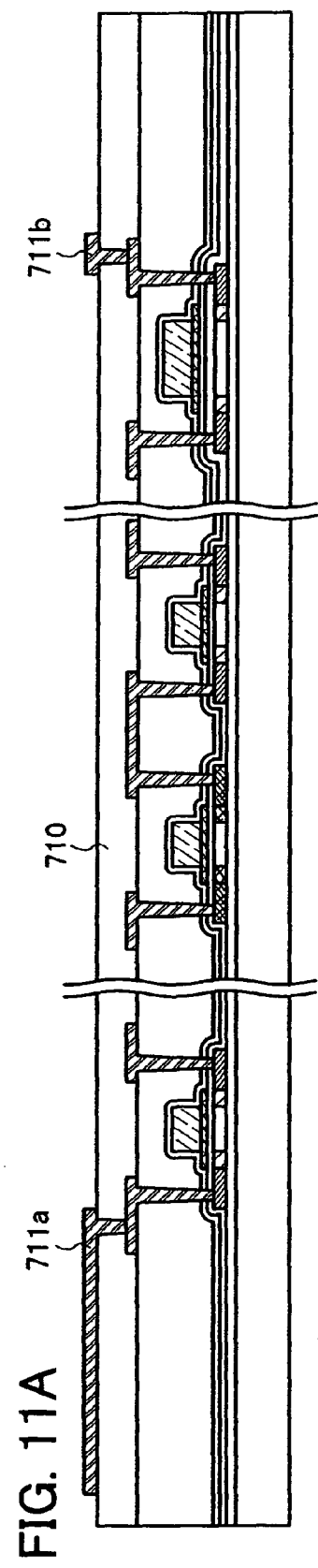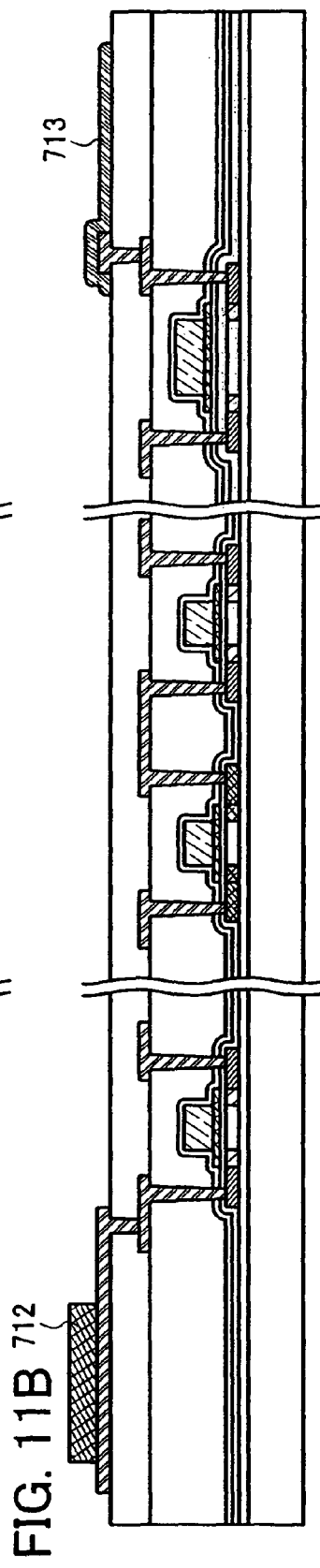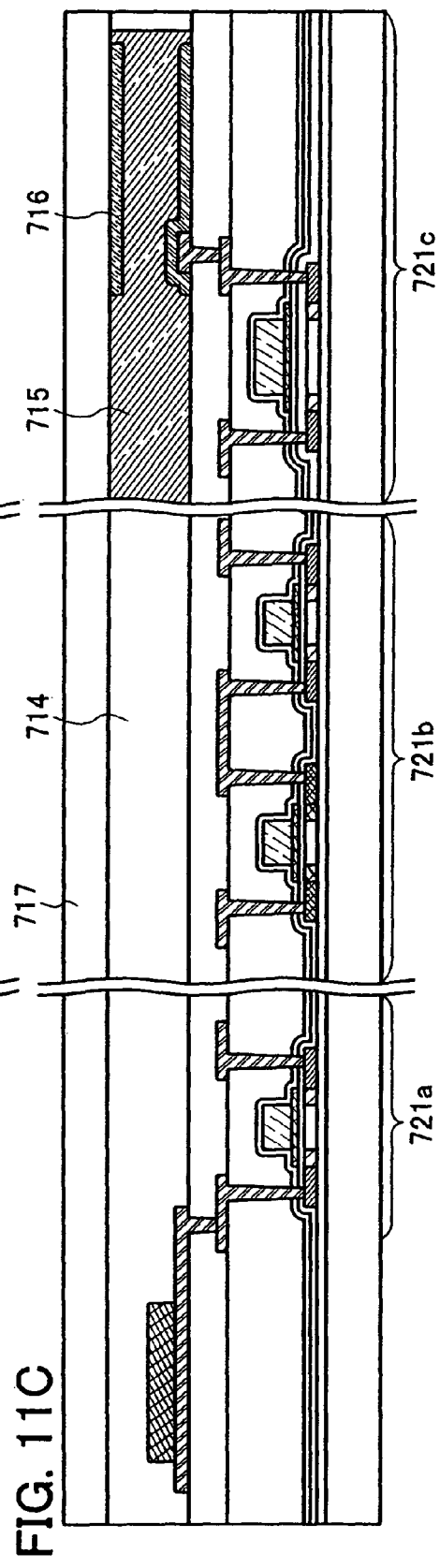

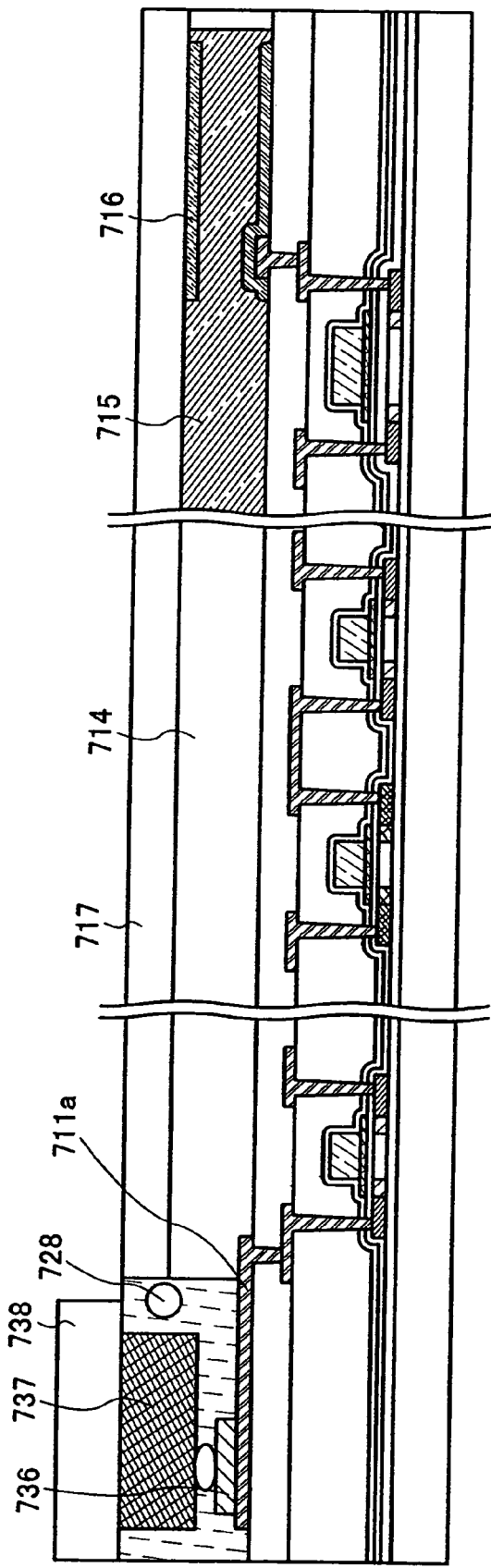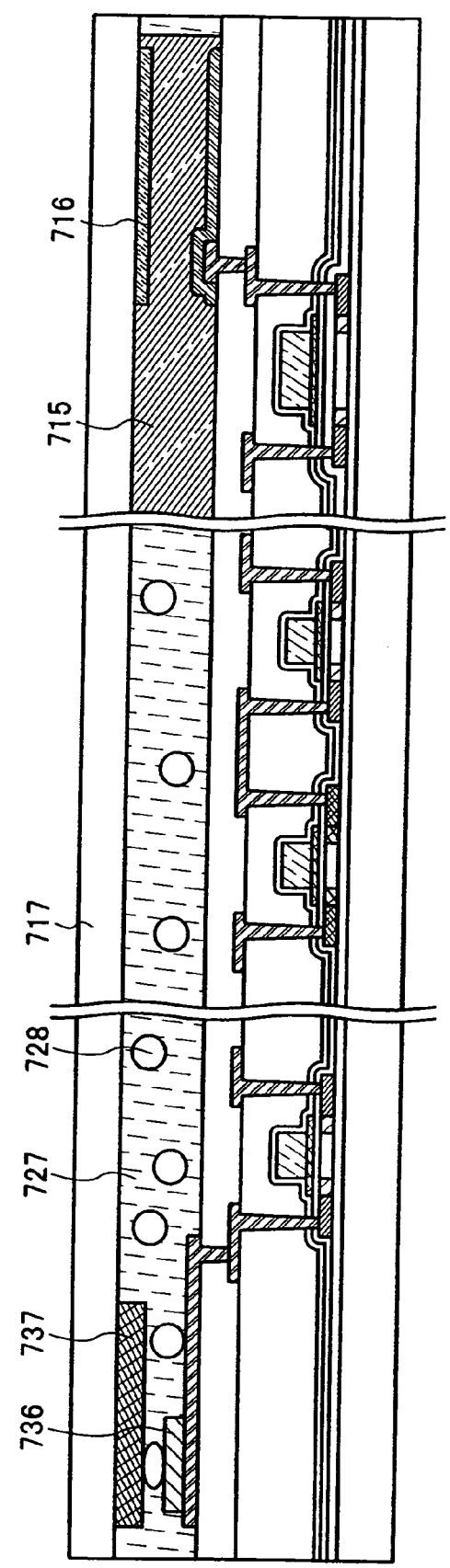

SEMICONDUCTOR DEVICE AND MANUFACTURING METHOD THEREOF

TECHNICAL FIELD

The present invention relates to an IC tag, an IC card, an IC label, or the like to which input and output of data are performed by wireless communication, and in particular, relates to the one provided with a display function.

BACKGROUND ART

Realization of ubiquitous society has been approached where information processing is performed by a computer network and its convenience can be enjoyed at various scenes of social life. A word "ubiquitous" is Latin which means "existing everywhere", which has been used as meaning of "there is no consciousness of a computer and information processing utilizing a computer is naturally integrated into our life environment".

As typical examples of such information processing, train tickets, an electronic road pricing system on highways, electronic money, and the like are known. In addition, spread of an RFID (Radio Frequency Identification) has also progressed where merchandise management which has been performed by a bar code conventionally has been performed by an IC tag to which transmission and reception of data have been performed by wireless communication. An IC tag is not only convenient for merchandise management but also is considered as a means for providing consumer benefit information.

A dedicated reading device has been required for an IC card or an IC tag, and there has been an inconvenience in that content stored in a semiconductor chip has not been able to be directly confirmed without the dedicated reading device. In view of this, a non-contact IC card provided with a display function, in which a display portion is provided for the IC card, has been considered (e.g., see Reference 1: Japanese Published Patent Application No. 2003-44808 and Reference 2: Japanese Published Patent Application No. 2003-223622).

DISCLOSURE OF INVENTION

In the conventional IC card provided with a display function, however, an IC chip for forming a high-frequency circuit, a logic circuit, a memory circuit, or the like and a display portion for displaying data have been required to be formed separately and mounted on one substrate. It has been required to provide a connection terminal or a wiring separately in order to connect the IC chip and the display portion; thus, there has been a problem of increasing a step for mounting. In addition, electric power supplied by an electromagnetic wave has been lost by a connection wiring for connecting the IC chip and the display portion; thus, there has been a problem in that the supplied electric power could not have been used effectively.

In addition, the IC chip formed using a silicon wafer and the display portion are different in thickness; thus, there has been a problem of spoiling the beauty of appearance because of irregularities on a surface even in the case of a thin card where the IC chip thicker than the element for forming the display portion is provided over the same substrate.

In view of the foregoing, it is an object of the present invention to provide a semiconductor device provided with a display function, which is capable of effectively utilizing electric power supplied by an electromagnetic wave. Further, it is another object of the present invention to achieve improvement of productivity of such a semiconductor device.

Further, it is another object of the present invention to improve the beauty of the semiconductor device provided with a display function.

In accordance with a semiconductor device of the present invention, the following are included: a conductive film functioning as an antenna; a power source generating circuit electrically connected to the conductive film functioning as an antenna; an integrated circuit and a display element electrically connected to the power source generating circuit; a first thin film transistor provided in the power source generating circuit; a second thin film transistor provided in the integrated circuit; a third thin film transistor provided in the display element; an insulating film provided to cover the first thin film transistor, the second thin film transistor, and the third thin film transistor; a source electrode and a drain electrode of the first thin film transistor, a source electrode and a drain electrode of the second thin film transistor, and a source electrode and a drain electrode of the third thin film transistor which are formed over the insulating film; and a pixel electrode electrically connected to the source electrode or the drain electrode of the third thin film transistor, in which the source electrode or the drain electrode of the first thin film transistor is electrically connected to the conductive film functioning as an antenna.

Further, in accordance with a semiconductor device of the present invention, in the above-described structure, the first thin film transistor includes a first semiconductor film, a first gate insulating film provided over the first semiconductor film, and a first gate electrode provided over the first gate insulating film; the second thin film transistor includes a second semiconductor film, a second gate insulating film provided over the second semiconductor film, and a second gate electrode provided over the second gate insulating film; the third thin film transistor includes a third semiconductor film, a third gate insulating film provided over the third semiconductor film, and a third gate electrode provided over the third gate insulating film; and the third gate insulating film is different in thickness from the first gate insulating film and the second gate insulating film. Further, the first thin film transistor, the second thin film transistor, and the third thin film transistor can be provided over the same substrate. As the substrate, a substrate having flexibility can be used.

Further, in accordance with a semiconductor device of the present invention, in the above-described structure, the display element can include a display portion, and a liquid crystal element, a light-emitting element, or an electrophoresis element can be provided in the display portion.

In accordance with a manufacturing method of a semiconductor device of the present invention, a semiconductor film is formed over a substrate; the semiconductor film is selectively etched to form a first semiconductor film and a second semiconductor film; a first gate insulating film is formed so as to cover the first semiconductor film and the second semiconductor film; the first gate insulating film formed above the second semiconductor film is selectively removed; the second semiconductor film is selectively etched to form a third semiconductor film; a second gate insulating film is formed so as to cover the third semiconductor film and the first gate insulating film formed over the first semiconductor film; a first gate electrode is formed above the first semiconductor film with the first gate insulating film and the second gate insulating film interposed therebetween; a second gate electrode is formed above the third semiconductor film with the second gate insulating film interposed therebetween; an impurity element is added into the first semiconductor film and the third semiconductor film to form source regions and drain regions; an interlayer insulating film is formed so as to cover the first gate electrode and the second gate electrode; over the interlayer insulating film, a first conductive film which is electrically connected to the source region or the drain region of the first semiconductor film, and a second conductive film which is electrically connected to the source region or the drain region of the third semiconductor film are formed; and a conductive film which functions as an antenna is formed so as to be electrically connected to the second conductive film.

Further, in accordance with another manufacturing method of a semiconductor device of the present invention, a semiconductor film is formed over a substrate; the semiconductor film is selectively etched to form a first semiconductor film and a second semiconductor film; a first gate insulating film is formed so as to cover the first semiconductor film and the second semiconductor film; the first gate insulating film formed above the second semiconductor film is selectively removed; the second semiconductor film is selectively etched to form a third semiconductor film; a second gate insulating film is formed so as to cover the third semiconductor film and the first gate insulating film formed over the first semiconductor film; a first gate electrode is formed above the first semiconductor film with the first gate insulating film and the second gate insulating film interposed therebetween; a second gate electrode is formed above the third semiconductor film with the second gate insulating film interposed therebetween; an impurity element is added into the first semiconductor film and the third semiconductor film to form source regions and drain regions; an interlayer insulating film is formed so as to cover the first gate electrode and the second gate electrode; over the interlayer insulating film, a first conductive film which is electrically connected to the source region or the drain region of the first semiconductor film, and a second conductive film which is electrically connected to the source region or the drain region of the third semiconductor film are formed; a pixel electrode is formed so as to be electrically connected to the first conductive film; and a conductive film which functions as an antenna is formed so as to be electrically connected to the second conductive film.

Further, in accordance with another manufacturing method of a semiconductor device of the present invention, a semiconductor film is formed over a substrate; a gate insulating film is formed so as to cover the semiconductor film; a gate electrode is formed above the semiconductor film with the gate insulating film interposed therebetween; an impurity element is added into the semiconductor film to form a source region and a drain region; an interlayer insulating film is formed so as to cover the gate electrode; over the interlayer insulating film, a first conductive film which functions as a pixel electrode, and a second conductive film which is electrically connected to the source region or the drain region of the semiconductor film are formed; a conductive film which functions as an antenna is formed so as to be electrically connected to the second conductive film; an opposing electrode is provided so as to be opposite to the first conductive film; and a microcapsule is formed between the first conductive film and the opposing electrode.

Since a semiconductor element and the like included in a power source generating circuit, an integrated circuit, a circuit of a display element, or the like are formed over the same substrate by the same process, the semiconductor device of the present invention can reduce the loss of electric power supplied by an electromagnetic wave so that the electric power supplied can be utilized effectively. Further, since the semiconductor element and the like included in the power source generating circuit, the integrated circuit, the circuit of the display element, or the like are formed over the same substrate by the same process, a step for mounting these circuits is omitted so that the manufacturing process can be simplified. Further, irregularities caused by difference in thickness between the display element and the integrated circuit can be reduced.

BRIEF DESCRIPTION OF DRAWINGS

FIGS. 11A to 11C show an example of a manufacturing method of a semiconductor device of the present invention.

FIGS. 17A and 17B show an example of a manufacturing method of a semiconductor device of the present invention.

BEST MODE FOR CARRYING OUT THE INVENTION

Figure 1A:
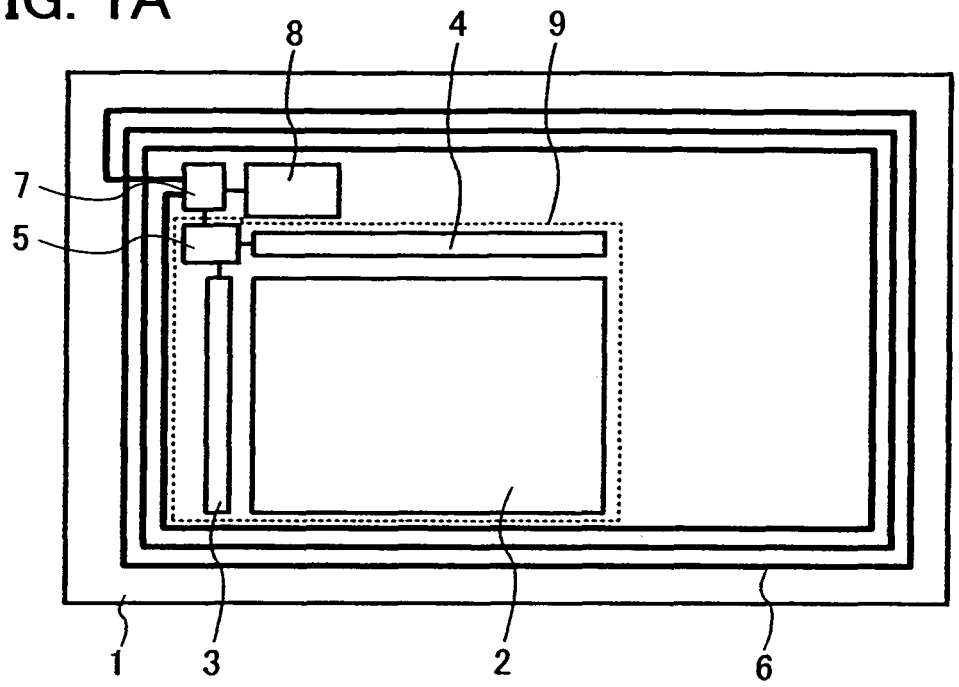
FIGS. 1A and 1B each show an example of a semiconductor device of the present invention.

Although the present invention will be described below by way of embodiment modes using the accompanying drawings, it is to be understood that various changes and modifications will be apparent to those skilled in the art. Therefore, unless such changes and modifications depart from the scope of the invention, they should be construed as being included therein. Note that the same portions may be denoted by the same reference numerals in the drawings in a structure of the present invention described hereinafter.

Embodiment Mode 1

An example of a non-contact IC card provided with a display function of the present invention will be described using the drawings in this embodiment mode.

Figure 1B:
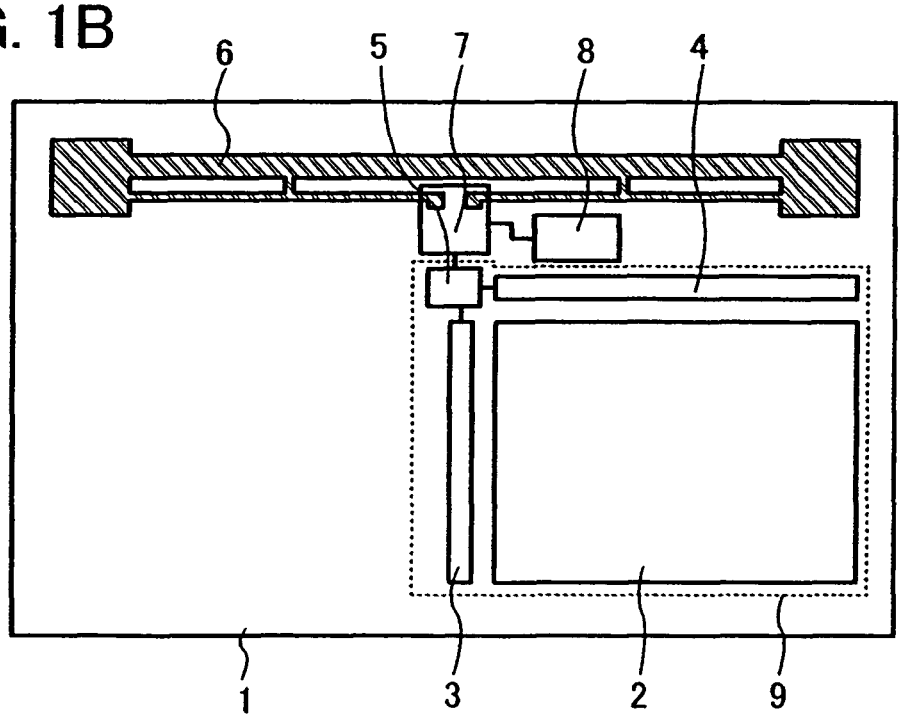

A non-contact IC card provided with a display function of the present invention includes, as shown in FIGS. 1A and 1B, a display portion 2 for displaying a signal transferred from a receiver (reader/writer), a gate driver 3 and a source driver 4 for driving the display portion 2, a controller 5 for controlling the operation of the gate driver 3 and the source driver 4, an antenna 6 for receiving an electromagnetic wave, a power source generating circuit 7 for generating a DC voltage from the electromagnetic wave received by the antenna, and an integrated circuit 8 having a unique identification number (UID), over a card-type substrate 1. Further, the IC card provided with a display function described in this embodiment mode can be rewritten an unlimited number of times.

In accordance with the non-contact IC card provided with a display function of the present invention, elements such as a transistor or a diode for forming a display element 9 including the display portion 2, the gate driver 3, the source driver 4, and the controller 5, the power source generating circuit 7, and the integrated circuit 8 are formed at the same time. For example, in the case where the display element 9, the power source generating circuit 7, and the integrated circuit 8 are formed using elements such as a thin film transistor (TFT), the circuits formed using the elements can be disposed as appropriate by forming the respective TFTs for forming the display element 9, the power source generating circuit 7, and the integrated circuit 8 at the same time. Therefore, by disposing the controller 5, the gate driver 3, the source driver 4, or the like requiring a high voltage for being driven close to the power source generating circuit 7, loss of electric power supplied by an electromagnetic wave can be minimized. This is because if the display element 9, the power source generating circuit 7, and the integrated circuit 8 are provided by, for example, being separately attached, electric power is lost since the circuits are connected by a connection wiring.

As the substrate 1, a glass substrate, a quartz substrate, a metal substrate, a plastic substrate, or the like can be used. Further, when the substrate 1 is required to be flexible, a plastic substrate is preferably used, and besides, a thin film of a glass substrate or a metal film of stainless steel or the like can also be used as the substrate 1.

The display portion 2 provided in the display element 9 is not restricted by whether either a still image or a moving image is displayed as long as a means for displaying data such as an image or video is provided. For example, in the display portion, a pixel can be formed using a liquid crystal element, a light-emitting element, an electrophoresis element, or the like. As a driving method of the display element 9 including the display portion 2, either an active matrix driving method or a passive matrix driving method can be used. In the case of an active matrix driving method, thin film transistors or organic TFTs can be formed in a plurality of pixels in the display portion.

The gate driver 3 and the source driver 4 are formed using thin film semiconductor elements such as a thin film transistor, a capacitor, a diode, a resistor, or an inductor.

As the antenna 6, an antenna having an optimum shape is provided as appropriate depending on a transmission system of the non-contact IC card provided with a display function. As the transmission system, an electromagnetic coupling system, an electromagnetic induction system, a microwave system, or the like can be used. In the case of employing, for example, an electromagnetic coupling system or an electromagnetic induction system (e.g., a 13.56 MHz band) as the transmission system, electromagnetic induction caused by a change in magnetic field density is utilized, and thus, the conductive film functioning as an antenna is formed with an annular shape (e.g., a loop antenna) or a spiral shape (e.g., a spiral antenna) (FIG. 1A). In the case of employing, for example, a microwave system (e.g., a UHF band (860 to 960 MHz band), a 2.45 GHz band, or the like) as the transmission system in the semiconductor device, the shape such as a length of the conductive film functioning as an antenna may be appropriately set in consideration of a wavelength of an electromagnetic wave used for signal transmission (FIG. 1B).

The conductive film functioning as an antenna can be formed of: a conductive material containing one or more of an element such as gold, silver, copper, palladium, aluminum, chromium, tungsten, titanium, molybdenum, or tantalum; and a metal compound.

The controller 5, the power source generating circuit 7, and the integrated circuit 8 are formed using thin film semiconductor elements such as a thin film transistor, a capacitor, a diode, a resistor, or an inductor.

Figure 2:
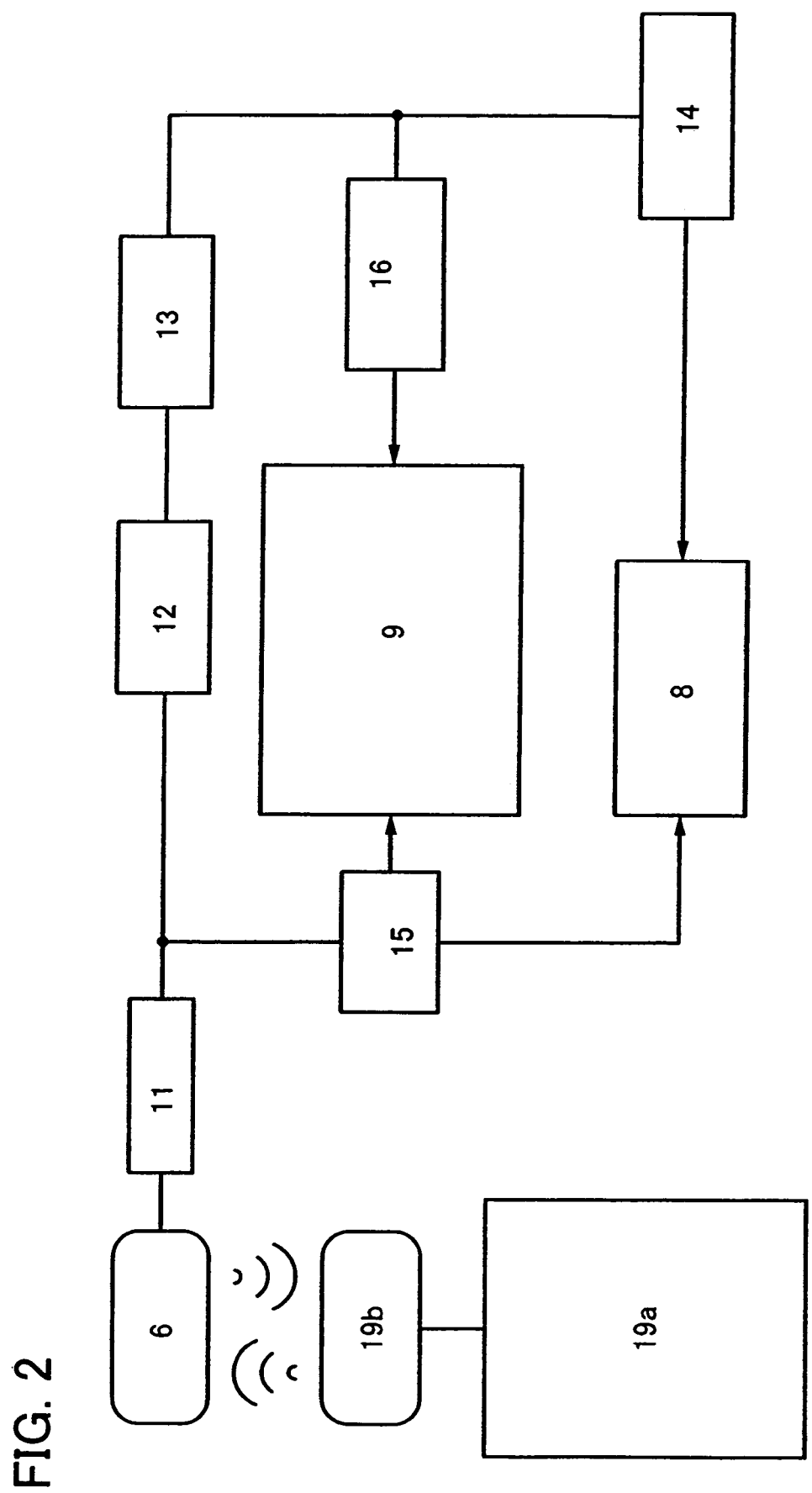
FIG. 2 shows an example of a circuit block diagram of a semiconductor device of the present invention.

FIG. 2 is an example of a circuit block diagram of the semiconductor device provided with a display function of the present invention. In the circuit of the semiconductor device provided with a display function of the present invention, an antenna 6 for receiving an electromagnetic wave, a wave detection capacitor 11 for detecting a high-frequency signal superimposed on the electromagnetic wave transmitted, a rectifier circuit 12 for generating a circuit-operating DC voltage from the electromagnetic wave received by the antenna 6, a holding capacitor 13 for suppressing voltage drop by a circuit operation at a chip response, a constant voltage circuit 14 for supplying a constant voltage as a power source for operating an integrated circuit, a signal separation circuit 15 for separating an integrated-circuit-operating signal and a display-portion-operating signal, a displaying power source circuit 16 for operating a display element 9, an integrated circuit 8, and the display element 9 are provided which are formed over the same substrate. The integrated circuit 8 and the display element 9 are operated by DC voltages from the constant voltage circuit 14 and the displaying power source circuit 16 respectively. Further, in the structure shown in FIG. 2, the wave detection capacitor 11, the rectifier circuit 12, the holding capacitor 13, the constant voltage circuit 14, the signal separation circuit 15, and the displaying power source circuit 16 can be provided in the power source generating circuit 7 shown in FIGS. 1A and 1B.

Specifically, an electromagnetic wave outputted from an antenna 19b provided in a system 19a is received by the antenna 6. From the electromagnetic wave received by the antenna 6, a high-frequency signal contained in the electromagnetic wave is detected in the wave detection capacitor 11. In the case where a high-frequency signal for operating the integrated circuit 8 is detected, a command signal is transmitted to the integrated circuit 8 side from the signal separation circuit 15. On the other hand, in the case where a high-frequency signal for operating the display element 9 is detected, a command signal is transmitted to the display element 9 side from the signal separation circuit 15.

Next, a circuit-operating DC voltage is generated in the rectifier circuit 12 from the electromagnetic wave received by the antenna 6. The generated DC voltage is supplied to the constant voltage circuit 14 and the displaying power source circuit 16. A voltage which has been made a constant voltage in the constant voltage circuit 14 is supplied to the integrated circuit 8 and a voltage which has not been made a constant voltage is supplied to the display element 9 from the displaying power source circuit 16. In the case where large electromagnetic energy is received by the antenna 6, the voltage supplied to the display element 9 is higher than the voltage supplied to the integrated circuit 8.

In particular, in the case where a microwave system in which a power source voltage is generated by directly receiving electromagnetic wave energy is employed, a power source voltage which is excessive for operating the integrated circuit 8 is generated in the rectifier circuit 12 when an electromagnetic wave transmitting source and an IC card are close to each other. Therefore, in order not to supply an excessive voltage to the integrated circuit 8, the constant voltage circuit 14 generally controls such that a voltage higher than a certain voltage is not supplied to the integrated circuit 8.

Figure 3:
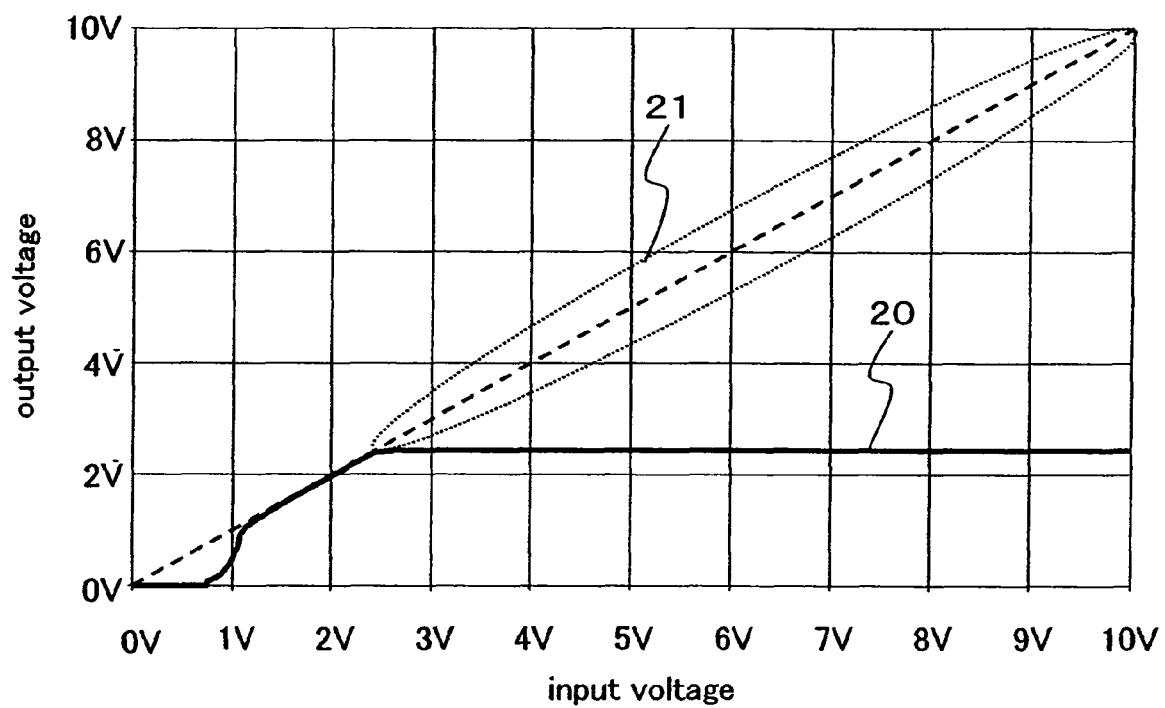
FIG. 3 shows calculation results of a constant voltage circuit of a semiconductor device of the present invention.

Calculation results of operation in the constant voltage circuit 14 used in this embodiment mode are shown in FIG. 3. The horizontal axis shows an input voltage to the constant voltage circuit 14 whereas the vertical axis shows an output voltage from the constant voltage circuit 14. A full line 20 in the graph shows calculation results of operation outputted from the constant voltage circuit 14. For reference, voltages inputted to the constant voltage circuit 14 are shown by a dotted line 21 in the graph.

Figure 4:
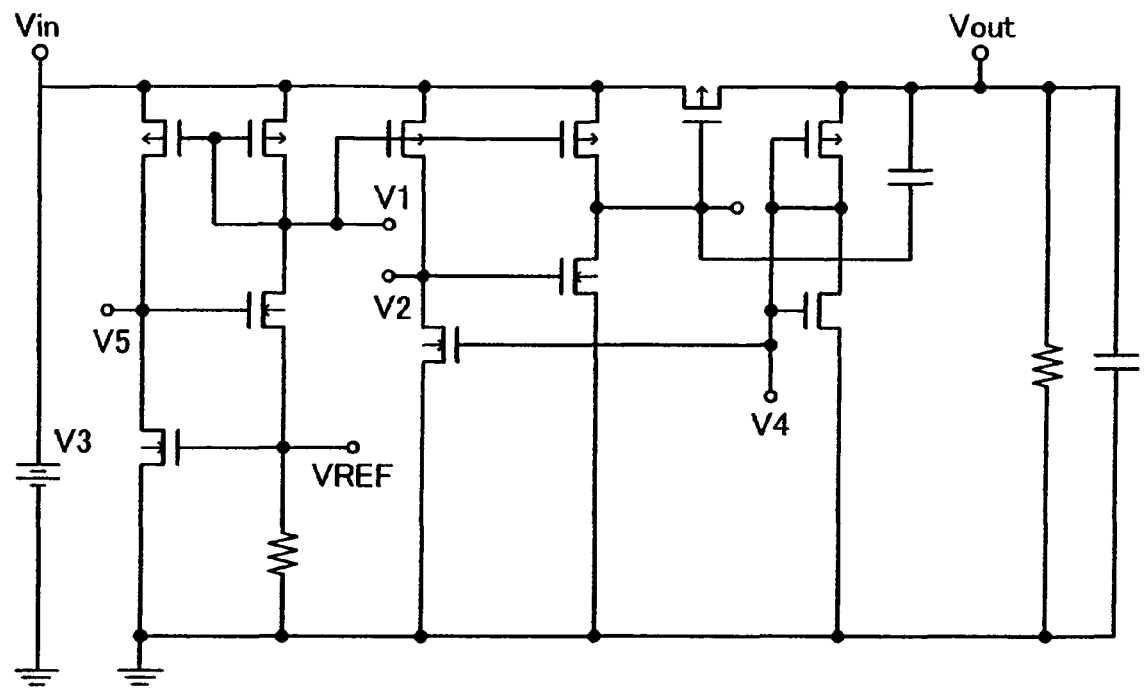
FIG. 4 shows an example of a constant voltage circuit of a semiconductor device of the present invention.

Here, a circuit model used in the operation calculation is shown in FIG. 4. Owing to the constant voltage circuit 14, an output voltage is constant even when high input voltage is applied. In the case of the constant voltage circuit 14 given as an example here, a constant voltage of approximately 2.5 V is outputted when the input voltage is 2.5 V or more.

For example, a voltage of approximately 10 V is generated in the rectifier circuit 12 when the electromagnetic wave transmitting source and the IC card are close to each other. Therefore, according to the present invention, a voltage of approximately 2.5 V which has been made a constant voltage in the constant voltage circuit 14 is supplied to the integrated circuit 8, whereas a voltage without through the constant voltage circuit 14 is supplied to the display element 9. Consequently, when the electromagnetic wave transmitting source and the IC card are put close to each other, a constant voltage is supplied to the integrated circuit 8 through the constant voltage circuit 14 although a voltage of approximately 10 V is generated in the rectifier circuit 12. Accordingly, by supplying a voltage to the display element 9 including the display portion 2, the gate driver 3, the source driver 4, the controller 5, or the like without through the constant voltage circuit 14, a voltage higher than a voltage supplied to the integrated circuit 8 can be supplied to the display element 9.

According to this embodiment mode, electric power is generated by an electromagnetic wave, and circuit operation is performed using the electric power as a power source. That is, there is no need to mount a battery for driving the display element. Therefore, this embodiment mode has a big-advantage in that a non-contact IC card provided with a display function can be made thinner and smaller.

Further, according to this embodiment mode, circuit operation of the display element is started by supplying electric power which is sufficient for driving the display element when the distance between the electromagnetic wave transmitting source and the IC card is small.

Further, in the IC card provided with a display function described in this embodiment mode, data is displayed on the display portion by operating the display element only when high electromagnetic wave energy is obtained at a position close to the electromagnetic wave transmitting source. Therefore, the IC card provided with a display function described in this embodiment mode is advantageous over other devices, particularly in the case of displaying data which is desired to be kept out of sight of others or data which is desired to be erased.

In the case of operating the integrated circuit and the display element even when electric power obtained from the electromagnetic wave transmitting source is small, a high voltage may be generated using a voltage step-up circuit.

Further, in the case of keeping displaying an image or video, which has been displayed once by putting the IC card close to the electromagnetic wave transmitting source, after taking the IC card away from the electromagnetic wave transmitting source, a power source holding capacitor, an auxiliary battery, or the like may also be mounted on the circuit. Such a power source holding capacitor or auxiliary battery may be either formed at the same time as the elements such as a TFT for forming each circuit, or formed separately to be mounted on the same substrate.

Further, by combing the display element with the integrated circuit, an image based on each data can be displayed by using a unique identification number provided for the integrated circuit. Further, by storing data of an IC card holder in the integrated circuit, data in accordance with his/her preference can be selectively obtained. This is a great advantage in ubiquitous society where the quantity of data is excessive.

Further, instead of storing holder's data in the integrated circuit, a system in which the holder's data of the integrated circuit is registered and data of a unique image or video is transmitted to each IC card based on the registered data by using a server through the Internet may also be constructed.

Note that the semiconductor device provided with a display function described in this embodiment mode is one means for effectively using redundant electric power obtained from the electromagnetic wave transmitting source. This redundant electric power can be utilized not only for driving the display element but also for operating a circuit of a sensor or MEMS (Micro Electro Mechanical System).

Embodiment Mode 2

An example of a manufacturing method of the semiconductor device provided with a display function described in the above embodiment mode will be described using the drawings in this embodiment mode.

First, a manufacturing method of an element included in the semiconductor device provided with a display function will be described. Specifically, a manufacturing method in the case where a thin film transistor is used as the element will be described.

Figure 5A:
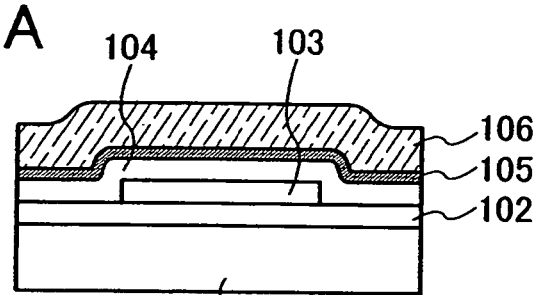
FIGS. 5A to 5E show an example of a manufacturing method of a semiconductor device of the present invention.

First, a base insulating film 102 is formed over a substrate 101, with a thickness of 100 to 300 nm as shown in FIG. 5A. As the substrate 101, an insulating substrate such as a glass substrate, a quartz substrate, a plastic substrate, or a ceramic substrate; a metal substrate; a semiconductor substrate; or the like can be used.

As the base insulating film 102, a single-layer structure or a multilayer structure of an insulating film containing oxygen or nitrogen such as silicon oxide ($SiO_x$), silicon nitride ($SiN_x$), silicon oxide containing nitrogen ($SiO_xN_y$) (x>y) (also called silicon oxynitride), or silicon nitride containing oxygen ($SiN_xO_y$) (x>y) (also called silicon nitride oxide) can be used. In particular, in the case where contamination from the substrate may occur, it is preferable to form the base insulating film.

Further, it is preferable that the base insulating film 102 which is in contact with a semiconductor film be a silicon nitride film or a silicon nitride oxide film with a thickness of 0.01 to 10 μm, preferably 100 to 300 nm. In a later crystallization step, when a crystallization method in which a metal element is added into a semiconductor film is used, gettering of the metal element is required. At this time, when the base insulating film is a silicon oxide film, in an interface between the silicon oxide film and a silicon film of the semiconductor film, the metal element in the silicon film and oxygen in the silicon oxide film react with each other to be metal oxide, so that the metal element may become difficult to be gettered. Thus, it is preferable that a layer other than a silicon oxide film be used for a portion of the base insulating film that is in contact with the semiconductor film.

Subsequently, a semiconductor film 103 with an island shape is formed over the base insulating film 102, with a thickness of 10 to 150 nm (see FIG. 5A). A material of the semiconductor film can be selected in accordance with the characteristics required of a TFT, and any of a silicon film, a silicon germanium film, and a silicon carbide film may be used. In this embodiment mode, the material of the semiconductor film is a silicon film. The island-shaped semiconductor film 103 is formed as follows; a semiconductor film is formed entirely over the base insulating film 102 by sputtering, an LPCVD method, a plasma CVD method, or the like, and patterned using a mask formed by a photolithography method or the like. In the case where the island-shaped semiconductor film 103 is formed using a crystalline semiconductor film, there are a method in which a crystalline semiconductor film is formed directly on the base insulating film 102 and a method in which an amorphous semiconductor film is formed over the base insulating film 102 and is crystallized by heat treatment to form a crystalline semiconductor film. In the latter method, the heat treatment for the crystallization is performed by using a heating furnace, laser irradiation, irradiation with light emitted from a lamp (hereinafter, referred to as lamp annealing) instead of laser light, or a combination thereof.

Further, a crystalline semiconductor film may also be formed by a heat crystallization method in which the above-described heat treatment is performed after nickel or the like is added into an amorphous semiconductor film. Note that when a crystalline semiconductor film is obtained by performing crystallization using the heat crystallization method using nickel, gettering treatment for removing nickel is preferably performed after the crystallization.

In the case of forming a crystalline semiconductor film by laser irradiation, a continuous wave laser beam (a CW laser beam) or a pulsed laser beam (a pulse laser beam) can be used. As the laser beam used here, a beam emitted from one or more of: a gas laser such as an Ar laser, a Kr laser, or an excimer laser; a laser containing, as a medium, either single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm and Ta; a glass laser; a ruby laser; an alexandrite laser, a Ti:sapphire laser; a copper vapor laser; and a gold vapor laser may be used. Large grain crystals can be obtained by irradiation with a fundamental wave or one of second to fourth harmonics of such a laser beam. For example, a second harmonic (532 nm) or a third harmonic (355 nm) of an Nd:$YVO_4$ laser (fundamental wave: 1064 nm) can be used; this laser can be emitted by either CW or pulse oscillation. In the case of CW, the laser beam is required to have an energy density of approximately 0.01 to 100 $MW/cm^2$ (preferably 0.1 to 10 $MW/cm^2$). Further, the irradiation is carried out at a scanning rate of approximately 10 to 2000 cm/sec.

Note that, a laser using, as a medium, either single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm and Ta; an Ar ion laser; or a Ti:sapphire laser can be continuously oscillated. Furthermore, pulse oscillation thereof can be performed with a repetition rate of 10 MHz or more by carrying out Q switch operation or mode synchronization. When a laser beam is oscillated with a repetition rate of 10 MHz or more, the semiconductor film is irradiated with a next pulse in a period after the semiconductor film is melted by the previous laser beam and before it is solidified. Therefore, unlike in the case of using a pulsed laser with a low repetition rate, a solid-liquid interface can be continuously moved in the semiconductor film so that crystal grains, which have continuously grown in a scanning direction, can be obtained.

When ceramic (polycrystal) is used for the medium, the medium can be formed to have a desired shape in a short time at low cost. When using a single crystal, a columnar medium with several mm in diameter and several tens of mm in length is generally used. In the case of using a ceramic, a medium bigger than the case of using the single crystal can be formed.

Concentration of a dopant such as Nd or Yb in a medium, which directly contributes to light emission, cannot be changed largely in both cases of the single crystal and the polycrystal, and therefore, there is a limitation in improvement in output of a laser by increasing the concentration of the dopant. In the case of the ceramic, however, the size of the medium can be significantly increased as compared with the case of the single crystal, and therefore, drastic improvement in output of a laser can be achieved.

Further, in the case of the ceramic, a medium with a parallelepiped shape or a rectangular parallelepiped shape can be easily formed. In the case of using a medium having such a shape, when oscillated light is made travel in a zigzag manner within the medium, a path of the oscillated light can be made long. Therefore, amplitude is increased and a laser beam can be oscillated at high output. Furthermore, a cross section of a laser beam emitted from a medium having such a shape has a quadrangular shape, and therefore, as compared with a laser beam with a circular shape, the laser beam with the quadrangular shape in the cross section is advantageous for being shaped into a linear beam. By shaping a laser beam emitted in the above described manner with an optical system, a linear beam with 1 mm or less in length of a short side and several mm to several m in length of a long side can be easily obtained. In addition, when a medium is uniformly irradiated with excited light, a linear beam is emitted with a uniform energy distribution in a long side direction.

When a semiconductor film is irradiated with this linear beam, the semiconductor film can be uniformly annealed. In the case where uniform annealing is required from one end to the other end of the linear beam, an ingenuity in which slits are provided in the both ends of the linear beam so as to shield an attenuated portion of energy from light, or the like is required.

In the case where a semiconductor film is annealed by using the thus obtained linear beam with uniform intensity and an electronic device is manufactured using this semiconductor film, characteristics of the electronic device can be made favorable and uniform.

Then, if necessary, doping with a slight amount of impurity element (boron or phosphorus) is performed to the semiconductor layer in order to control the threshold value of the transistor. Ion doping with plasma excitation of diborane ($B_2H_6$) without mass separation is used here.

Then, a gate insulating film 104 is formed with a thickness of 10 to 200 nm so as to cover the island-shaped semiconductor film 103 (see FIG. 5A). The gate insulating film 104 may have a multilayer structure by appropriately combining any of silicon oxide ($SiO_x$), silicon nitride ($SiN_x$), silicon oxide containing nitrogen ($SiO_xN_y$) (x>y), silicon nitride containing oxygen ($SiN_xO_y$) (x>y), and the like by a CVD method or sputtering. In this embodiment mode, the gate insulating film 104 has a multilayer structure of a $SiN_xO_y$ film and a $SiO_xN_y$ film.

Subsequently, a first conductive film 105 and a second conductive film 106, each of which forms a gate electrode, are formed over the gate insulating film 104 (see FIG. 5A). First, the first conductive film 105 is formed with a thickness of 5 to 50 nm. As the first conductive film 105, an aluminum (Al)

film, a copper (Cu) film, a film containing aluminum or copper as its main component, a chromium (Cr) film, a tantalum (Ta) film, a tantalum nitride (TaN) film, a titanium (Ti) film, a tungsten (W) film, a molybdenum (Mo) film, or the like can be used. The second conductive film 106 is formed thereover with a thickness of 150 to 500 nm. As the second conductive film 106, for example, a chromium (Cr) film, a tantalum (Ta) film, a film containing tantalum as its main component, or the like can be used. It is to be noted that the first conductive film 105 and the second conductive film 106 are required to be a combination in which, in etching each film, one film has a selective ratio to the other film. As a combination of the first conductive film and the second conductive film, in which one film has a selective ratio to the other, for example, a combination of Al and Ta, Al and Ti, or TaN and W can be used. In this embodiment mode, the first conductive film 105 is TaN and the second conductive film 106 is W.

Figure 5B:
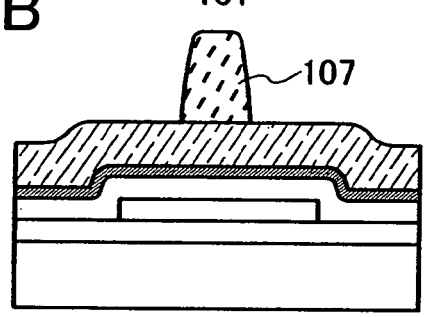

Next, a first resist 107 is formed over the second conductive film by photolithography using a photo mask (see FIG. 5B).

Figure 5C:
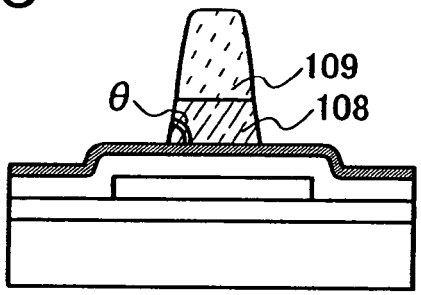

Then, a first etching is performed using the first resist 107 as a mask (see FIG. 5B). In the first etching, the second conductive film 106 is etched to form a first gate electrode 108 from the second conductive film 106. At this time, the etching is preferably performed below a condition of a high selective ratio with respect to the first conductive film 105 so as not to etch the first conductive film 105. The first resist 107 is also etched to be a second resist 109; the recess width of the first resist 107 to the second resist 109 is, however, not shown. At this time, the side face of the first gate electrode 108 has a taper angle $\theta$ of $80° \leq \theta \leq 90°$, which is an almost perpendicular taper angle (see FIG. 5C).

In the first etching, a mixed gas of $Cl_2$, $SF_6$, and $O_2$ is used as an etching gas, and the flow rate is $Cl_2/SF_6/O_2=33/33/10$ (sccm). Plasma is generated by supplying electric power of 2000 W to a coil-shaped electrode at a pressure of 0.67 Pa. Electric power of 50 W is applied to a substrate side (sample stage).

Figure 5D:
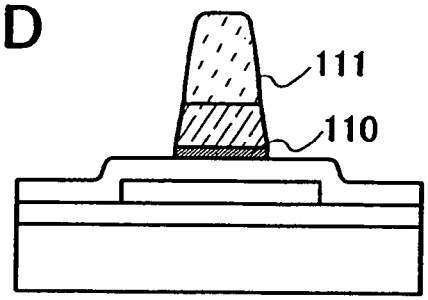

Next, a second etching is performed to the first conductive film by using the first gate electrode 108 as a mask (see FIG. 5D). By the second etching, a first gate electrode 110 is formed from the first conductive film. At this time, the etching is preferably performed below a condition of a high selective ratio with respect to the gate insulating film 104 so as not to etch the gate insulating film 104. In the second etching condition, plasma is generated by supplying electric power of 2000 W to the coil-shaped electrode at a pressure of 0.67 Pa Electric power of 50 W is supplied to the substrate side (sample stage). An etching gas is $Cl_2$. It is to be noted that the second resist 109 is also etched and recessed to be a third resist 111; the recessed state is, however, not shown.

Figure 5E:
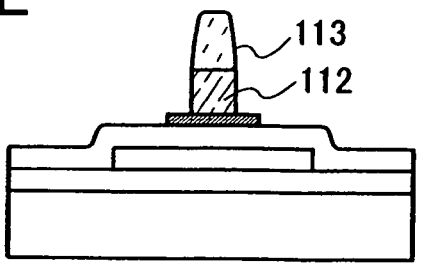

Then, a third etching is performed (see FIG. 5E). In the third etching condition, plasma is generated by supplying electric power of 2000 W to the coil-shaped electrode at a pressure of 1.33 Pa. Electric power is not supplied to the substrate side (sample stage). An etching gas is a mixed gas of $Cl_2$, $SF_6$, and $O_2$, and the flow rate is $Cl_2/SF_6/O_2=22/22/30$ (sccm). By the third etching, the third resist 111 is recessed, and at the same time, the gate length of the first gate electrode 108 is also similarly recessed by using the third resist 111 as a mask to form a third gate electrode 112. It is to be noted that the recessed third resist 111 becomes a fourth resist 113. After that, the fourth resist 113 is removed.

In the third etching, it is concerned that the side face of the third gate electrode 112 might be etched (side-etching). When the side face of the third gate electrode 112 is etched, the gate length in the middle becomes the shortest than that of the top surface or the bottom surface; thus, a cross-section of the third gate electrode 112 has a shape constricted in the middle. Accordingly, the coverage of a film formed over the third gate electrode 112 gets worse; thus, breaking of wirings tends to easily occur. In addition, since the third gate electrode is used as a doping mask in forming an LDD region, it becomes difficult to control the LDD length. This side-etching is a phenomenon which occurs because the etching rate of the first gate electrode is higher than the etching rate of the resist. Therefore, in this embodiment mode, the etching rate of the first gate electrode is lowered by setting a sample stage temperature to be as low as $-10°$ C. or less, so that the side-etching can be suppressed.

Through the above steps, a gate electrode with a shape which becomes narrower toward top can be obtained. The gate electrode with such a shape is formed by utilizing the resist recess width in etching. Specifically, the recess width of the third resist 111 to the fourth resist 113 in the third etching is a difference between the gate length of the third gate electrode and that of the second gate electrode. Alternatively, the total of recess widths of the resist in the second etching and the third etching, namely the recess width of the second resist 109 to the fourth resist 113 is a difference between the gate length of the third gate electrode and that of the second gate electrode.

In accordance with a manufacturing method of a gate electrode of the present invention, the difference between the gate length of the second gate electrode and that of the third gate electrode (Lov length) can be 20 to 200 nm, so that an extremely minute gate electrode structure can be formed.

The first to third etchings of this embodiment mode can be conducted by dry etching, and specifically, an ICP (Inductively Coupled Plasma) etching method can be used.

Figure 6A:
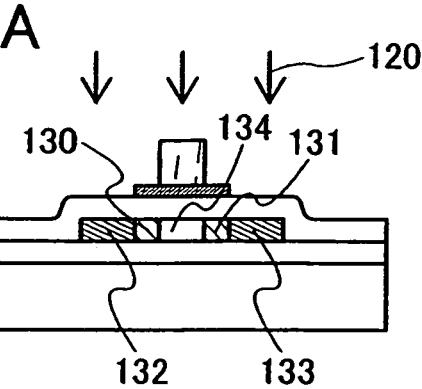
FIGS. 6A and 6B show an example of a manufacturing method of a semiconductor device of the present invention.

Next, doping of a low-concentration impurity ion 120 is performed to the island-shaped semiconductor film 103 (see FIG. 6A). The island-shaped semiconductor film 103 is doped with the low-concentration impurity element through the second gate electrode and the gate insulating film, thereby low-concentration impurity regions 130 and 131 are formed in a part of the island-shaped semiconductor film where the second gate electrode is overlapped. In addition, at the same time, both end portions of the island-shaped semiconductor film are also doped with an impurity element only through the gate insulating film, thereby high-concentration impurity regions 132 and 133 are formed. A channel-forming region 134 is also formed. The impurity element concentration of each of the low-concentration impurity regions 130 and 131 is $1\times10^{16}$ to $1\times10^{20}$ atoms/$cm^3$ (preferably, $1\times10^{16}$ to $5\times10^{18}$ atoms/$cm^3$). Ion doping or ion implantation can be used as the doping method. For example, boron (B), gallium (Ga), or the like is used as the impurity element when a p-type semiconductor is formed, whereas phosphorus (P), arsenic (As), or the like is used when an n-type semiconductor is formed.

The doping for forming the low-concentration impurity regions 130 and 131 is conducted not only through the gate insulating film but also through the second gate electrode 110. Therefore, the concentration of the impurity element of the low-concentration impurity regions 130 and 131 is lower than that of the high-concentration impurity regions 132 and 133.

Figure 6B:
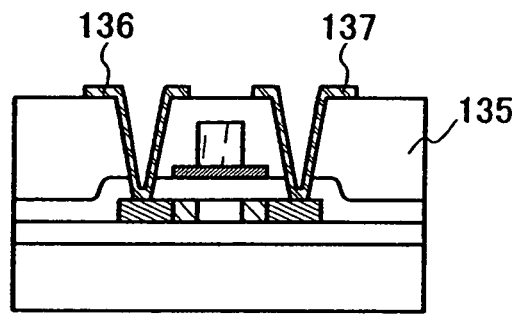

Then, an interlayer insulating film 135 is formed (see FIG. 6B). The interlayer insulating film 135 is formed using either an organic material or an inorganic material. The interlayer insulating film 135 may have either a single-layer structure or a multilayer structure. Contact holes for exposing the high-concentration impurity regions 132 and 133 are formed in the interlayer insulating film 135 by etching. After that, a conductive layer is formed so as to fill the contact holes and is etched, thereby wirings 136 and 137 are formed.

Note that before the interlayer insulating film is formed, or after the first-layer film or the second-layer film is formed when the interlayer insulating film has a multilayer structure, thermal activation of the impurity regions can also be performed. For the thermal activation, a method such as laser light irradiation, RTA, or heat treatment using a furnace can be used.

In the structure of this embodiment mode, the high-concentration impurity regions 132 and 133 in FIG. 6B become a source region and a drain region later. In addition, the low-concentration impurity regions 130 and 131, which are overlapped with the second gate electrode 110 with the gate insulating film 104 interposed therebetween, are formed.

In this manner, by providing the low-concentration impurity regions below the gate electrode with the gate insulating film interposed therebetween, decrease of the ON-current value can be prevented and high reliability can be realized. In addition, a minute TFT in which a region where the gate electrode and each low-concentration impurity region overlap each other in the direction of a channel length (length between a source region and a drain region in a channel region) is 20 to 200 nm long and the channel length is 0.1 to 1.0 μm can be formed. Therefore, even in the case of an extremely minute TFT, an overlapped region appropriate for its size can be formed and a predetermined ON-current value can be obtained.

Note that although the TFT in which the gate electrode and the low-concentration impurity regions overlap each other with the gate insulating film interposed therebetween is manufactured in FIG. 6B, a TFT in which the gate electrode and the low-concentration impurity regions overlap each other only partially may be provided as well.

Figure 7A:
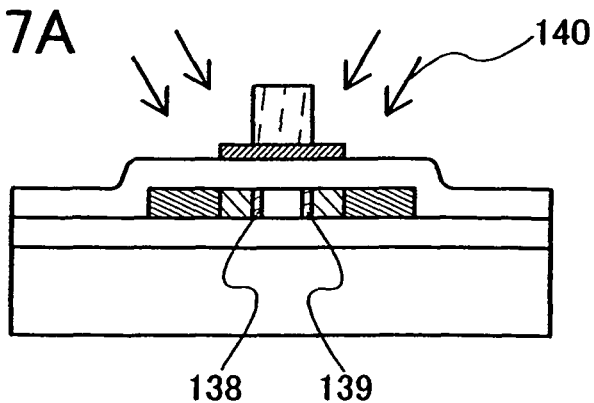
FIGS. 7A and 7B show an example of a manufacturing method of a semiconductor device of the present invention.

Further, low-concentration impurity regions 138 and 139 can also be formed between the low-concentration impurity regions 130 and 131 and the channel-forming region 134. This structure is called a pocket structure. As shown in FIG. 7A, oblique doping of an impurity ion 140 is performed using the second gate electrode 110 as a mask. The oblique doping may be conducted either before or after the first doping. As for the conductivity type of the impurity ion 140, a p-type impurity ion is used in the case of an n-channel TFT, whereas an n-type impurity ion is used in the case of a p-channel TFT. The low concentration impurity regions 138 and 139 are formed by the oblique doping of the impurity ion 140.

Figure 7B:
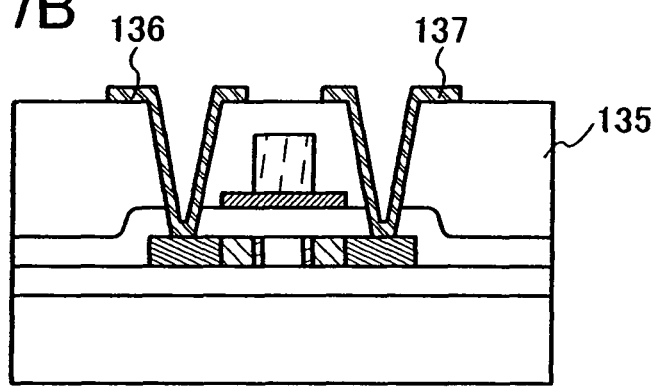

After the impurity regions 138 and 139 are formed, a structure of FIG. 7B is obtained through the steps shown in FIG. 6B. By employing the pocket structure, short channel effect can be more suppressed.

Hereinbefore, one example of a manufacturing method of a TFT used in the present invention is described. The above-described TFT can realize a semiconductor device with high reliability and little deterioration even in the case of a miniaturized semiconductor device.

Further, as described in this embodiment mode, when TFTs are provided in pixels in a display portion and a circuit for forming an integrated circuit for example, it is preferable to form gate insulating films of the TFT provided in the pixel and of the TFT provided in the integrated circuit to be different in thickness. This is because in the integrated circuit where a driving voltage is low and variation in the threshold voltage is required to be reduced, it is preferable to provide a TFT including a thin gate insulating film, whereas in the pixel where a driving voltage is high and high-pressure resistance of a gate insulating film is required, it is preferable to provide a TFT including a thick gate insulating film. For example, for the circuit where the driving voltage is low and variation in the threshold voltage is required to be reduced, it is preferable to form each gate insulating film shown in FIGS. 5A to 5E, 6A and 6B, and 7A and 7B at a thickness of 10 to 50 nm. On the other hand, for the circuit where the driving voltage is high and high-pressure resistance of a gate insulating film is required, it is preferable to form a gate insulating film at a thickness of 40 to 200 nm.

Here, a method of forming TFTs which are different in thickness of a gate insulating film at the same time will be described using FIGS. 8A to 8C and 9A to 9C.

Figure 8A:
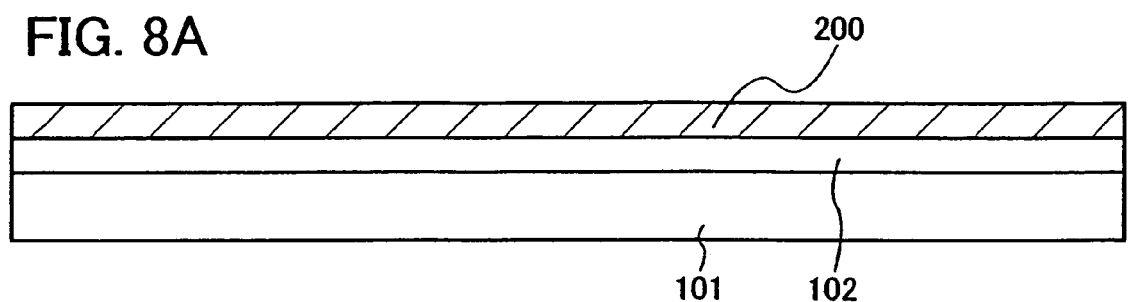
FIGS. 8A to 8C show an example of a manufacturing method of a semiconductor device of the present invention.
Figure 8B:
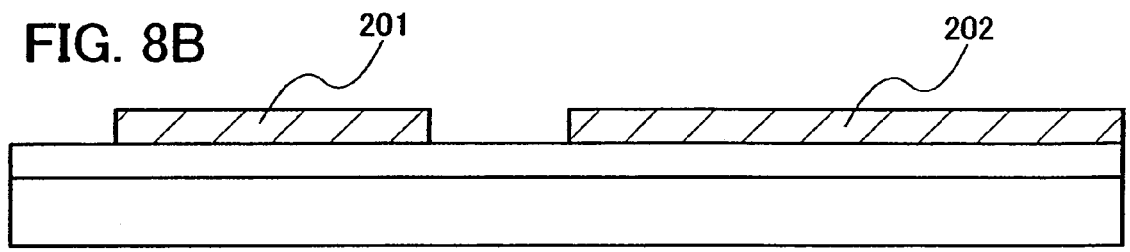

First, a base insulating film 102 is formed over a substrate 101, with a thickness of 100 to 300 nm as shown in FIG. 8A. As the substrate 101, an insulating substrate such as a glass substrate, a quartz substrate, a plastic substrate, or a ceramic substrate; a metal substrate; a semiconductor substrate; or the like can be used.

As the base insulating film 102, a single-layer structure or a multilayer structure of an insulating film containing oxygen or nitrogen such as silicon oxide ($SiO_x$), silicon nitride ($SiN_x$), silicon oxide containing nitrogen ($SiO_xN_y$) (x>y) (also called silicon oxynitride), or silicon nitride containing oxygen ($SiN_xO_y$) (x>y) (also called silicon nitride oxide) can be used. In particular, in the case where contamination from the substrate may occur, it is preferable to form the base insulating film.

Further, it is preferable that the base insulating film 102 that is in contact with a semiconductor film be a silicon nitride film or a silicon nitride oxide film with a thickness of 0.01 to 10 μm, preferably 100 to 300 nm. In a later crystallization step, when a crystallization method in which a metal element is added into a semiconductor film is used, gettering of the metal element is required. In this time, when the base insulating film is a silicon oxide film, in an interface between the silicon oxide film and a silicon film of the semiconductor film, the metal element in the silicon film and oxygen in the silicon oxide film react with each other to be metal oxide, so that the metal element may be unlikely to be gettered. Thus, it is preferable that a layer other than a silicon oxide film be used for a portion of the base insulating film that is in contact with the semiconductor film.

Subsequently, a semiconductor film 200 with a thickness of 10 to 150 mm is formed on the base insulating film 102 (see FIG. 8A). A material of the semiconductor film can be selected in accordance with the characteristics required of a TFT, and any of a silicon film, a silicon germanium film, and a silicon carbide film may be used. In this embodiment mode, the material of the semiconductor film is a silicon film.

After that, the semiconductor film 200 is selectively etched to form semiconductor films 201 and 202. Note that, here, the semiconductor film to be used for a circuit where high-pressure resistance of a gate insulating film is required is etched into an island-shape so that the semiconductor film 201 is formed in plural numbers (see FIG. 8B).

Figure 8C:
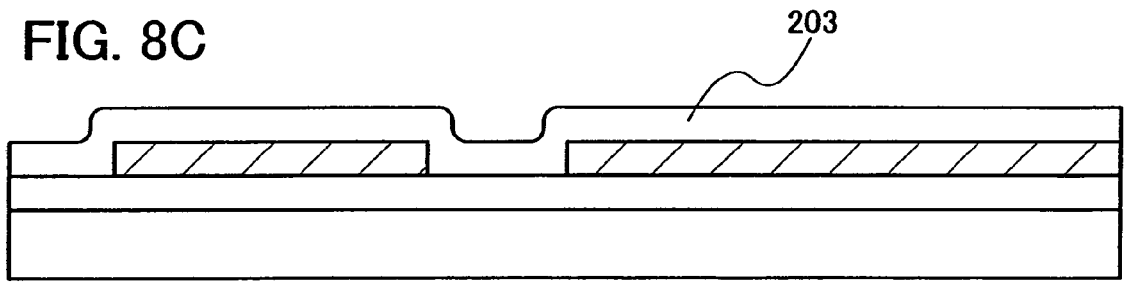

Then, a gate insulating film 203 is formed with a thickness of 10 to 200 nm so as to cover the island-shaped semiconductor film 201 and the semiconductor film 202 (see FIG. 8C). The gate insulating film 203 may have a multilayer structure by appropriately combining any of silicon oxide ($SiO_x$), silicon nitride ($SiN_x$), silicon oxide containing nitrogen ($SiO_xN_y$) (x>y), silicon nitride containing oxygen ($SiN_xO_y$) (x>y), and the like by a CVD method or sputtering. In this embodiment mode, the gate insulating film 203 has a multilayer structure with a thickness of 50 to 100 nm of a $SiN_xO_y$ film and a $SiO_xN_y$ film.

Figure 9A:
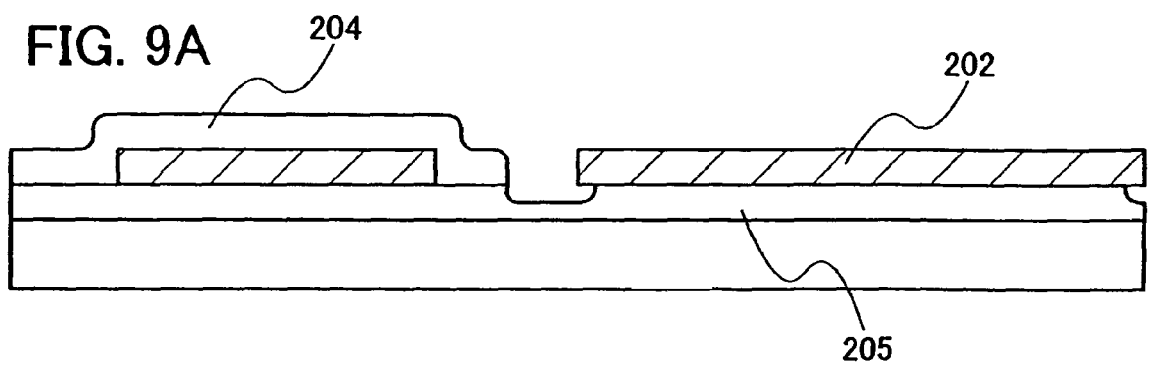
FIGS. 9A to 9C show an example of a manufacturing method of a semiconductor device of the present invention.
Figure 9B:
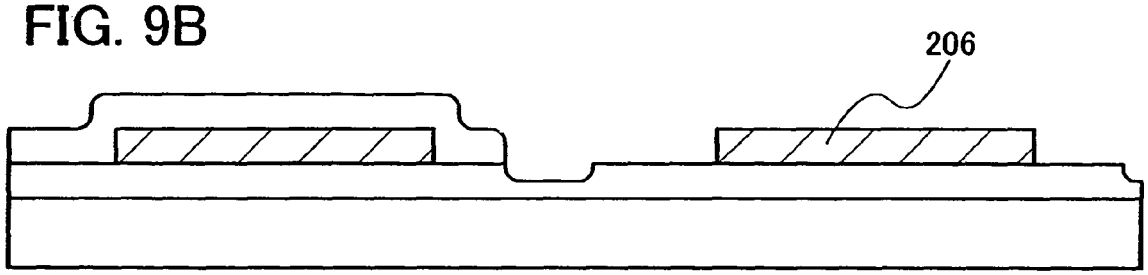

Subsequently, the semiconductor film 201 used for the circuit where high-pressure resistance of a gate insulating film is required, and the gate insulating film 203 which covers the semiconductor film 201 are covered with a mask, and the gate insulating film 203 where the semiconductor film 202 is formed below is selectively removed, thereby forming a gate insulating film 204 (see FIG. 9A). The etching of the gate insulating film 203 is conducted by wet etching using fluorinated acid diluted with pure water to a concentration of 1/100. This is because an adverse effect on the semiconductor film 202 by dry etching, such as plasma damage or an etching product, can be reduced.

Further, when the gate insulating film 204 is formed using wet etching, a base film 205 below the semiconductor film 202 is partially etched. If a gate insulting film is formed so as to cover the semiconductor film 202 with this state, the gate insulting film cannot be formed uniformly around the semiconductor film 202. This causes an increase in variation of TFT characteristics and increase of leakage current.

Therefore, the semiconductor film 202 is selectively etched so that a semiconductor film 206 to be used for a circuit where variation in a threshold voltage is required to be small is formed. Here, the island-shaped semiconductor film 206 is formed on an inner side than the portions of the base film 205 which have been etched by the wet-etching (see FIG. 9B).

Figure 9C:
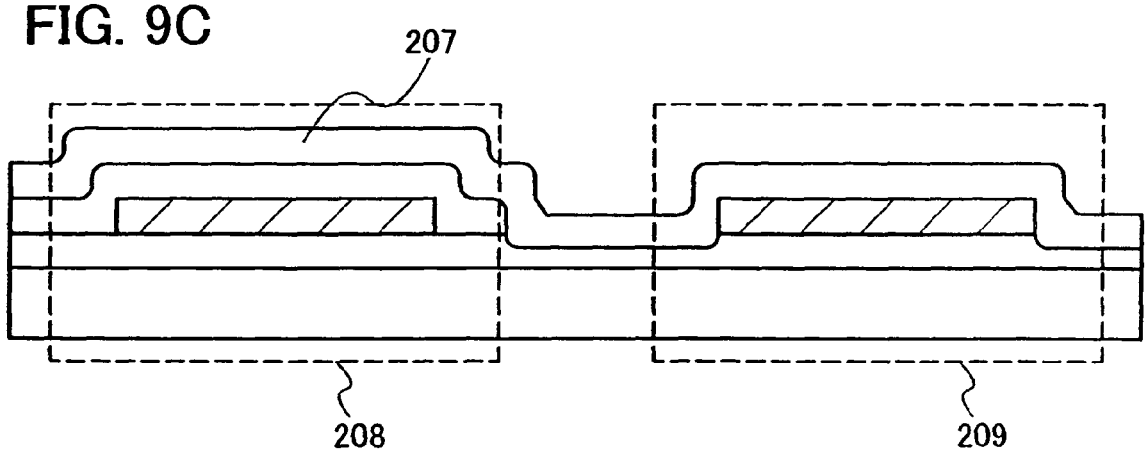

Then, a gate insulating film 207 is formed with a thickness of 10 to 200 nm so as to cover the island-shaped semiconductor films 201 and 206 and the gate insulating film 204 (see FIG. 9C). The gate insulating film 207 may have a multilayer structure by appropriately combining any of silicon oxide ($SiO_x$), silicon nitride ($SiN_x$), silicon oxide containing nitrogen ($SiO_xN_y$) (x>y), silicon nitride containing oxygen ($SiN_xO_y$) (x>y), and the like by a CVD method or sputtering. In this embodiment mode, the gate insulating film 207 has a multilayer structure with a thickness of 5 nm to 50 nm, of a $SiN_xO_y$ film and a $SiO_xN_y$ film.

In this manner, gate insulating films 208 and 209 which are different in thickness can be formed. The gate insulating film 208 which is thick is formed with a total thickness of 55 to 150 nm, and the gate insulating film 209 which is thin is formed with a thickness of 5 to 50 nm in this embodiment mode.

Embodiment Mode 3

In this embodiment mode, a manufacturing method of a semiconductor device provided with a display function will be described using the drawings.

Figure 10A:
FIGS. 10A to 10D show an example of a manufacturing method of a semiconductor device of the present invention.

First, an insulating film 702 which becomes a base and an amorphous semiconductor film 703 (e.g., a film including amorphous silicon) are formed over a surface of a substrate 701 (see FIG. 10A). Note that the insulating film 702 and the amorphous semiconductor film 703 can be formed consecutively.

As the substrate 701, a glass substrate, a quartz substrate, a metal substrate of stainless steel or the like having an insulating film formed on its surface, a plastic substrate having heat resistance to the treatment temperature of this step, or the like can be used. With such a substrate, area and shape thereof are not particularly restricted; therefore, by using a rectangular substrate with at least one meter on a side as the substrate 701, for example, productivity can be drastically improved. This is a great advantage as compared to the case of using a round silicon substrate.

As the insulating film 702, a single layer or multilayer of a film containing oxide of silicon or nitride of silicon is formed by sputtering, a plasma CVD method, or the like. In the case where the base insulating film has a two-layer structure, a silicon nitride oxide film may be formed as the first layer, and a silicon oxynitride film may be formed as the second layer, for example. In the case where the base insulating film has a three-layer structure, a silicon oxide film, a silicon nitride oxide film, and a silicon oxynitride film may be formed as the first insulating film, the second insulating film, and the third insulating film, respectively. Alternatively, a silicon oxynitride film, a silicon nitride oxide film, and a silicon oxynitride film may be formed as the first insulating film, the second insulating film, and the third insulating film, respectively. The insulating film which becomes a base functions as a blocking film for preventing entry of an impurity from the substrate 701.

The semiconductor film 703 is formed with a thickness of 25 to 200 nm (preferably 30 to 150 nm) by sputtering, an LPCVD method, a plasma CVD method, or the like.

Figure 10B:
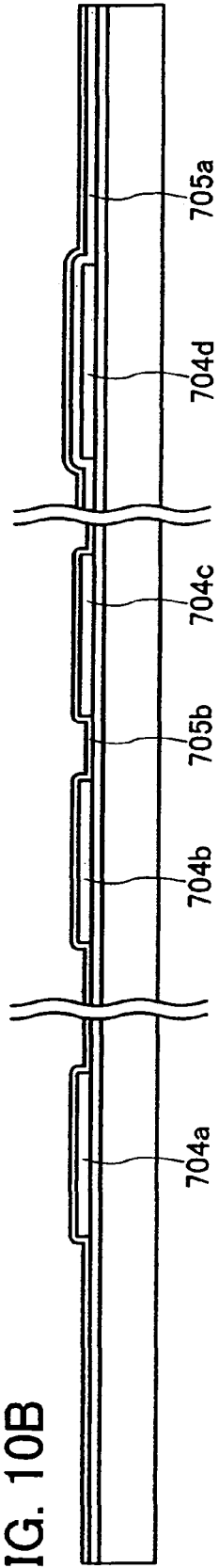

Next, the amorphous semiconductor film 703 is crystallized by a known crystallization method (a laser crystallization method, a thermal crystallization method using RTA or an annealing furnace, a thermal crystallization method using a metal element which promotes crystallization, a method in which a laser crystallization method is combined with a thermal crystallization method using a metal element which promotes crystallization, or the like) to form a crystalline semiconductor film. After that, the semiconductor film 703 is selectively etched, thereby semiconductor films 704a to 704d are formed. Here, by using the method shown in FIGS. 8A to 8C and 9A to 9C, a gate insulating film is formed with a small thickness for a circuit where the driving voltage is low and variation of the threshold voltage are required to be small, whereas a gate insulating film is formed with a large thickness for a circuit where the driving voltage is high and high-pressure resistance of a gate insulating film is required. Specifically, in this embodiment mode, a gate insulating film 705b is formed over the semiconductor film 704a for forming a thin film transistor of a power source generating circuit and the semiconductor films 704b and 704c for forming thin film transistors of an integrated circuit, whereas multilayer of a gate insulating film 705a and the gate insulating film 705b is formed over the semiconductor film 704d for forming a thin film transistor of a pixel in a pixel portion (FIG. 10B).

An example of a manufacturing process of the crystalline semiconductor films 704a to 704d will be briefly described. First, an amorphous semiconductor film is formed with a thickness of 50 to 60 nm by a plasma CVD method. Next, a solution containing nickel that is a metal element which promotes crystallization is retained on the amorphous semiconductor film, and dehydrogenation treatment (at 500° C. for one hour) and thermal crystallization treatment (at 550° C. for four hours) are performed to the amorphous semiconductor film, thereby a crystalline semiconductor film is formed. Subsequently, the crystalline semiconductor film is irradiated with laser light as needed, and a photolithography method is used to form the crystalline semiconductor films 704a to 704d.

In the case of forming the crystalline semiconductor film by a laser crystallization method, a continuous wave laser beam (a CW laser beam) or a pulsed laser beam (a pulse laser beam) can be used. As the laser beam used here, a beam emitted from one or more of: a gas laser such as an Ar laser, a Kr laser, or an excimer laser; a laser containing, as a medium, either single crystalline YAG, $YVO_4$, forsterite ($Mg_2SiO_4$), $YAlO_3$, or $GdVO_4$ or polycrystalline (ceramic) YAG, $Y_2O_3$, $YVO_4$, $YAlO_3$, or $GdVO_4$ doped with one or more of Nd, Yb, Cr, Ti, Ho, Er, Tm and Ta; a glass laser; a ruby laser; an alexandrite laser; a Ti:sapphire laser; a copper vapor laser; and a gold vapor laser may be used. Large grain crystals can be obtained by irradiation with a fundamental wave or one of second to fourth harmonics of such a laser beam. For example, a second harmonic (532 nm) or a third harmonic (355 nm) of an Nd:$YVO_4$ laser (fundamental wave: 1064 nm)

can be used. In this case, the laser beam is required to have an energy density of approximately 0.01 to 100 MW/cm² (preferably 0.1 to 10 MW/cm²). Further, the irradiation is carried out at a scanning rate of approximately 10 to 2000 cm/sec. Note that, a laser using, as a medium, either single crystalline YAG, YVO₄, forsterite (Mg₂SiO₄), YAlO₃, or GdVO₄ or polycrystalline (ceramic) YAG, Y₂O₃, YVO₄, YAlO₃, or GdVO₄ doped with one or more of Nd, Yb, Cr, Ti, Ho, Er, Tm and Ta; an Ar ion laser; or a Ti:sapphire laser can be continuously oscillated. Furthermore, pulse oscillation thereof can be performed with a repetition rate of 10 MHz or more by carrying out Q switch operation or mode synchronization. When a laser beam is oscillated with a repetition rate of 10 MHz or more, the semiconductor film is irradiated with a subsequent pulse in a period during which the semiconductor film is melted and then solidified by the laser beam. Therefore, unlike in the case of using a pulsed laser with a low repetition rate, a solid-liquid interface can be continuously moved in the semiconductor film so that crystal grains, which continuously grow in a scanning direction, can be obtained.

In the case where crystallization of the amorphous semiconductor film is performed by using a metal element which promotes crystallization, it is advantageous in that the crystallization can be performed at a low temperature in short time, and that the orientation of crystals becomes uniform. On the other hand, there is a problem that the property is not stable because the off current is increased by the residual metal element in the crystalline semiconductor film. Therefore, it is preferable to form an amorphous semiconductor film functioning as a gettering site on the crystalline semiconductor film. The amorphous semiconductor film functioning as a gettering site, which is required to contain an impurity element such as phosphorus or argon, is preferably formed by sputtering by which argon can be contained at a high concentration. After that, heat treatment (an RTA method, thermal annealing using an annealing furnace, or the like) is performed to diffuse the metal element into the amorphous semiconductor film, and the amorphous semiconductor film containing the metal element is removed. In this manner, the amount of the metal element contained in the crystalline semiconductor film can be reduced or removed.

Each of the gate insulating films 705a and 705b may also have a multilayer structure by appropriately combining any of silicon oxide (SiO$_x$), silicon nitride (SiN$_x$), silicon oxide containing nitrogen (SiO$_x$N$_y$) (x>y), silicon nitride containing oxygen (SiN$_x$O$_y$) (x>y), and the like by a CVD method or sputtering. In this embodiment mode, each of the gate insulating films 705a and 705b has a multilayer structure of a SiN$_x$O$_y$ film and a SiO$_x$N$_y$ film.

Further, the semiconductor films 704a to 704d, which are crystallized by irradiating the semiconductor film with a continuous wave laser or with a laser beam that oscillates at a repetition rate of 10 MHz or more while each semiconductor film is scanned in one direction, have a characteristic that crystals grow in the scanning direction of the beam. By forming transistors so that the scanning direction is the same as a channel length direction (a direction in which carriers flow when a channel is formed) thereof, and combining the above-mentioned gate insulating layers, thin film transistors (TFTs) with few characteristic variation and high electric field effect mobility can be obtained.

Next, a first conductive film and a second conductive film are stacked over the gate insulating film 705b. Here, the first conductive film is formed with a thickness of 20 to 100 nm by a plasma CVD method, sputtering, or the like, and the second conductive film is formed with a thickness of 100 to 400 nm. The first conductive film and the second conductive film are each formed of: an element selected from tantalum (Ta), tungsten (W), titanium (Ti), molybdenum (Mo), aluminum (Al), copper (Cu), chromium (Cr), niobium (Nb) or the like; or an alloy material or a compound material containing the foregoing element as its main component. Alternatively, they are formed of a semiconductor material represented by polycrystalline silicon doped with an impurity element such as phosphorus. As examples of a combination of the first conductive film and the second conductive film, a tantalum nitride film and a tungsten film, a tungsten nitride film and a tungsten film, a molybdenum nitride film and a molybdenum film, and the like can be given. Since tungsten or tantalum nitride has high heat resistance, heat treatment for thermal activation can be performed after the first conductive film and the second conductive film are formed. In addition, in the case of forming a three-layer structure instead of a two-layer structure, a multilayer structure of a molybdenum film, an aluminum film, and a molybdenum film is preferably adopted.

Figure 10C:
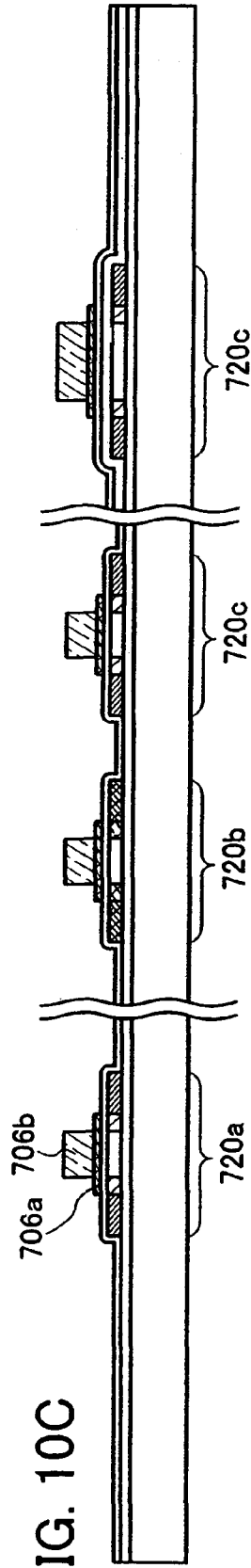

Next, using the method shown in FIGS. 5A to 5E and 6A and 6B, gate electrodes 706a and 706b are formed over each of the semiconductor films 704a to 704d, and then an impurity element is selectively added into the semiconductor films 704a to 704d, thereby source regions, drain regions, and LDD regions are formed. Consequently, thin film transistors 720b to 720d including the semiconductor films 704a to 704d respectively can be obtained (FIG. 10C). Here, an n-type impurity element is added into the semiconductor films 704a, 704c, and 704d, while a p-type impurity element is added into the semiconductor film 704b, so that the thin film transistors 720b, 720c, and 720d become n-channel TFTs and the thin film transistor 720b becomes a p-channel TFT.

Figure 10D:
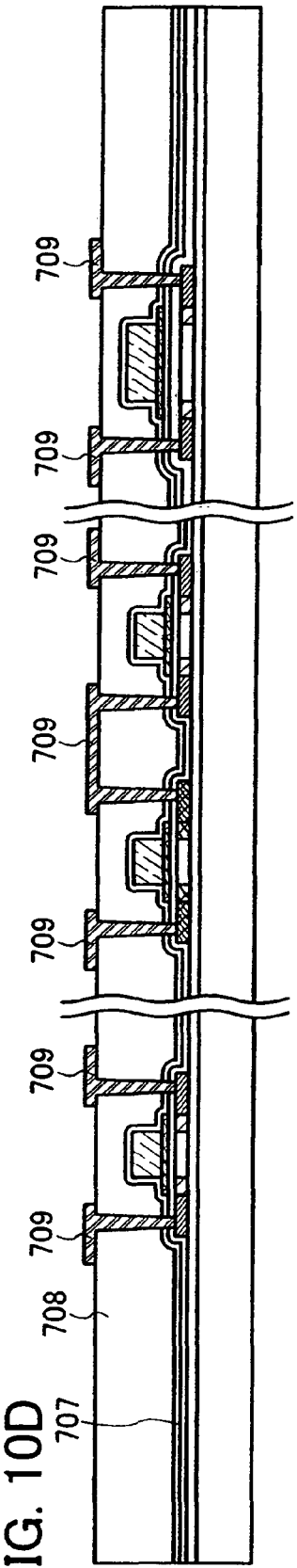

Subsequently, an insulating film is formed with a single layer or a multilayer so as to cover the gate electrodes 706a and 706b and the gate insulating film 705b. Here, an insulating film 707 and an insulating film 708 are stacked (FIG. 10D). The insulating films 707 and 708 are formed with a single layer or a multilayer using an inorganic material such as oxide of silicon or nitride of silicon, an organic material such as polyimide, polyamide, benzocyclobutene, acrylic, or epoxy, or siloxane, or the like, by a CVD method, sputtering, a SOG method, a droplet discharging method, a screen printing method, or the like. For example, a silicon nitride oxide film can be formed as the first-layer insulating film 707, and a silicon oxynitride film can be formed as the second-layer insulating film 708.

Note that before the insulating films 707 and 708 are formed or after one or more of thin films of the insulating films 707 and 708 are formed, heat treatment for recovering crystallinity of the semiconductor film, for activating the impurity element which has been added into the semiconductor film, or for hydrogenating the semiconductor film is preferably performed. For the heat treatment, a thermal annealing method, a laser annealing method, an RTA method, or the like is preferably adopted.

Next, the insulating films 707 and 708 and the like are etched by a photolithography method, thereby contact holes are formed to expose the source regions and the drain regions of the semiconductor films 704a to 704d. Then, a conductive film is formed so as to fill the contact holes and selectively etched to form conductive films 709 each functioning as a source electrode or a drain electrode of the semiconductor films 704a to 704d. Note that before the conductive film is formed, silicide may also be formed on each surface of the semiconductor films 704a to 704d exposed at the contact holes.

The conductive films 709 are formed with a single layer or a multilayer using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (Ca), or silicon (Si) or an alloy material or a compound material containing the foregoing element as its main component by a CVD method, sputtering, or the like. An alloy material containing aluminum as its main component corresponds to, for example, a material containing nickel and containing aluminum as its main component, or an alloy material containing nickel and one or both of carbon and silicon and containing aluminum as its main component. Each of the conductive films 709 preferably employs, for example, a multilayer structure of a barrier film, an aluminum-silicon (Al—Si) film, and a barrier film, or a multilayer structure of a barrier film, an aluminum-silicon (Al—Si) film, a titanium nitride (TiN) film, and a barrier film. Note that a barrier film corresponds to a thin film formed of titanium, nitride of titanium, molybdenum, or nitride of molybdenum. Aluminum and aluminum-silicon which have low resistance and are inexpensive are optimal materials for forming the conductive films 709. In addition, generation of a hillock of aluminum or aluminum-silicon can be prevented when upper and lower barrier layers are provided. Furthermore, when the barrier film is formed of titanium that is a highly-reducible element, even if a thin natural oxide film is formed on the crystalline semiconductor film, the natural oxide film is reduced so that preferable contact with the crystalline semiconductor film can be obtained.

Next, an insulating film 710 is formed to cover the conductive films 709, and is selectively etched to form contact holes, and after that, conductive films 711a and 711b are selectively formed so as to be electrically connected to the conductive film 709 (see FIG. 11A). The conductive film 711a is electrically connected to the source region or the drain region of the thin film transistor 720b, while the conductive film 711b is electrically connected to the source region or the drain region of the thin film transistor 720d. The conductive films 711a and 711b may be either formed at the same time with the same material or formed separately from each other. The conductive films 711a and 711b can be formed using any of the above-described materials for forming the conductive film 709. The insulating film 710 is formed with a single layer or a multilayer using an inorganic material or an organic material by a CVD method, sputtering, a SOG method, a droplet discharging method, a screen printing method, or the like. Further, the insulating film 710 is preferably formed with a thickness of 0.75 to 3 μm. The insulating film 710 can be formed using any of the above-described materials for forming the insulating films 707 and 708.

Next, a conductive film 712 functioning as an antenna is formed over the conductive film 711a. The conductive film 712 is formed with a conductive material by a CVD method, sputtering, a droplet discharging method, a screen printing method, or the like (see FIG. 11B). Preferably, the conductive film 712 is formed with a single layer or multilayer of an element selected from aluminum (Al), titanium (Ti), silver (Ag), copper (Cu), and gold (Au) or an alloy material or a compound material containing the element as its main component. In this embodiment mode, paste containing silver is formed over the conductive film 711a by a screen printing method and then heat treatment at a temperature of 50 to 350° C. is performed to form the conductive film 712. Further, after the conductive film 712 is formed over the conductive film 711a, laser light irradiation may also be performed to the region where the conductive film 711a and the conductive film 712 overlap each other in order to improve the electrical connection therebetween.

Next, a conductive film 713 functioning as a pixel electrode is formed to cover the conductive film 711b. As the conductive film 713, an indium tin oxide film (ITO film), an indium tin oxide film containing silicon, or a transparent conductive film formed by sputtering using a target in which 2 to 20 wt % of zinc oxide (ZnO) is mixed into indium oxide can be used. Other than the above, in the case where a display portion is formed to be reflective or provided with a self-luminous display element, a single layer or multilayer of an element selected from aluminum (Al), tungsten (W), titanium (Ti), nickel (Ni), platinum (Pt), copper (Cu), gold (Au) and silver (Ag) or an alloy material or a compound material containing the element as its main component can be used as well. As the multilayer structure, a three-layer structure of a titanium nitride film, a film containing aluminum as its main component, and a titanium nitride film can be used for example. It is preferable to employ a multilayer structure because resistance as a wiring is low and favorable ohmic contact can be obtained. In particular, in the case where it is difficult to provide a light source such as a backlight, such as a non-contact IC card provided with a display function, it is preferable to use a self-luminous light-emitting element or an electrophoresis element in the display portion and a metal such as aluminum, titanium, silver, or tungsten is preferably used for forming the conductive film 713.

Further, in the case where the same material can be used for forming the conductive film 711b and the conductive film 712, the conductive film 711b can also function as a pixel electrode without providing the conductive film 713. Moreover, in this case, by forming the conductive films 711a and 711b at the same time with the same material, the process can be simplified.

Further, in the case where the conductive film 712 and the conductive film 713 are formed with the same material, the process can be simplified by providing them at the same time. Note that in FIGS. 11A to 11C, without providing the conductive film 710, the conductive film 712 may be formed over the same layer (the insulating film 708 here) as the conductive film 709 so as to be electrically connected to the source electrode or the drain electrode of the thin film transistor 720a, and the conductive film 713 may be formed over the insulating film 708 so as to be electrically connected to the conductive film 709 which functions as the source electrode or the drain electrode of the thin film transistor 720d. In the case where the conductive film 710 is not provided, a manufacturing process can be simplified. On the other hand, it is preferable to provide the conductive film 710 when the conductive film 712 functioning as an antenna and the conductive film 713 functioning as a pixel electrode are desired to be provided more freely. As described above, without providing the conductive film 713, the conductive film 709 which functions as the source electrode or the drain electrode of the thin film transistor 720d may be provided as a pixel electrode.

Next, a liquid crystal element is provided in a region 721c where a display portion is provided. Specifically, a liquid crystal material is provided between the conductive film 713 functioning as a pixel electrode and a conductive film functioning as an opposing electrode.

In FIGS. 11A to 11C, an insulating film 714 is formed so as to cover the conductive film 712, in a region 721a where a power source generating circuit is provided and a region 721b where an integrated circuit is provided, whereas a spacer is provided in the region 721c where a display portion is provided. The spacer may be formed with the same material at the same time as the insulating film 714. Then, an alignment film is formed over the conductive film 713, a liquid crystal material 715 is dropped onto the region 721c where a display portion is provided, and an opposing substrate 717 provided with a conductive film 716 functioning as an opposing electrode is attached by pressure bonding (see FIG. 11C). Over the opposing substrate 717, the opposing electrode formed of a transparent conductive film, and an alignment film which has been subjected to rubbing treatment are formed; and a color filter or the like may be formed in addition to them. Further, a polarizing plate is attached to a surface opposite to the surface on which the conductive film 716 is formed, of the opposing substrate 717. As the opposing substrate 717, a substrate having a light-transmitting property, such as a glass substrate, a quartz substrate, or a plastic substrate can be used.

Through the above steps, a semiconductor device provided with a display function can be manufactured.

Although the case where the liquid crystal element is provided in the region 721c where a display portion is provided is shown in FIGS. 11A to 11C, the present invention is not limited to this. For example, a light-emitting element or an electrophoresis element may be provided instead of the liquid crystal element. A structure where an electrophoresis element is provided is shown in FIG. 12.

Figure 12:
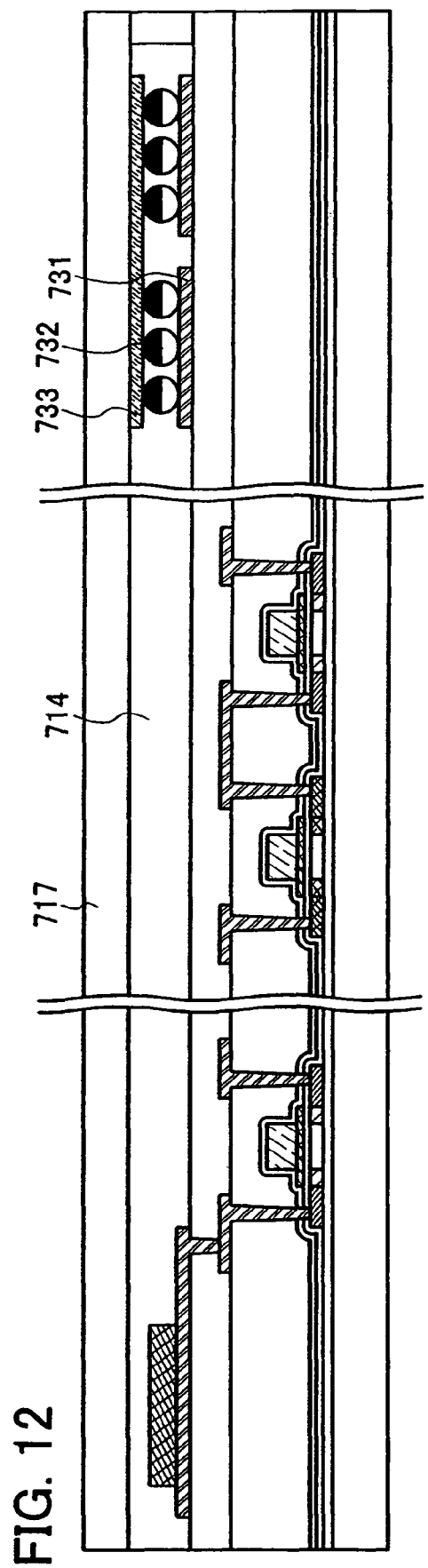
FIG. 12 shows an example of a manufacturing method of a semiconductor device of the present invention.

As the electrophoresis element, a structure in which a microcapsule 732 encapsulating a transparent liquid, white fine particles which are charged positively and black fine particles which are charged negatively, having a diameter of approximately 10 to 200 μm is used can be employed (see FIG. 12). In this microcapsule 732, each white fine particle and each black fine particle move in directions opposite from each other when an electric field is applied by conductive films 731 and 733, thereby color white or black can be displayed. A display element applying this principle is an electrophoresis element, which is generally called electronic paper. As for the electrophoresis element, an auxiliary light is not required since the reflectance is high as compared to a light crystal element, power consumption thereof is low, and a display portion can be recognized even in a dim place. Further, an image which has been displayed once can be retained even when power is not supplied to a display portion; therefore, an image which has been displayed once can be held even when the semiconductor device provided with a display function is taken away from an electromagnetic wave transmitting source.

Note that although the case where the conductive film 712 functioning as an antenna is formed so as to be electrically connected to the conductive film 709 is shown in FIGS. 10A to 10D, 11A to 11C, and 12, a substrate where a conductive film functioning as an antenna is formed may be attached alternatively. For example, as shown in FIG. 17A, a conductive film 736 functioning as a bump is provided over the conductive film 711a, and the conductive film 736 and a conductive film 737 functioning as an antenna are attached to be electrically connected to each other. Note that the conductive film 737 functioning as an antenna is provided in advance over a substrate 738. As the substrate 738, a substrate having flexibility, such as a glass substrate, a quartz substrate, or a plastic substrate can be used.

The conductive film 736 and the conductive film 737 functioning as an antenna are electrically connected to each other by a conductive particle 728 contained in an adhesive resin 727.

Alternatively, as shown in FIG. 17B, the conductive film 737 functioning as an antenna may be provided over the opposing substrate 717, and then attachment may be performed. In this case, the conductive film 737 functioning as an antenna and the conductive film 716 functioning as an opposing electrode which are provided over the opposing substrate 717, can be provided with the same material at the same time.

Further alternatively, elements such as a thin film transistor may be formed over the substrate 701, and after that, the elements may be peeled from the substrate 701 and provided over a substrate having flexibility, such as a plastic substrate. A manufacturing method of this case will be described using FIGS. 15A to 15C and 16.

Figure 15:
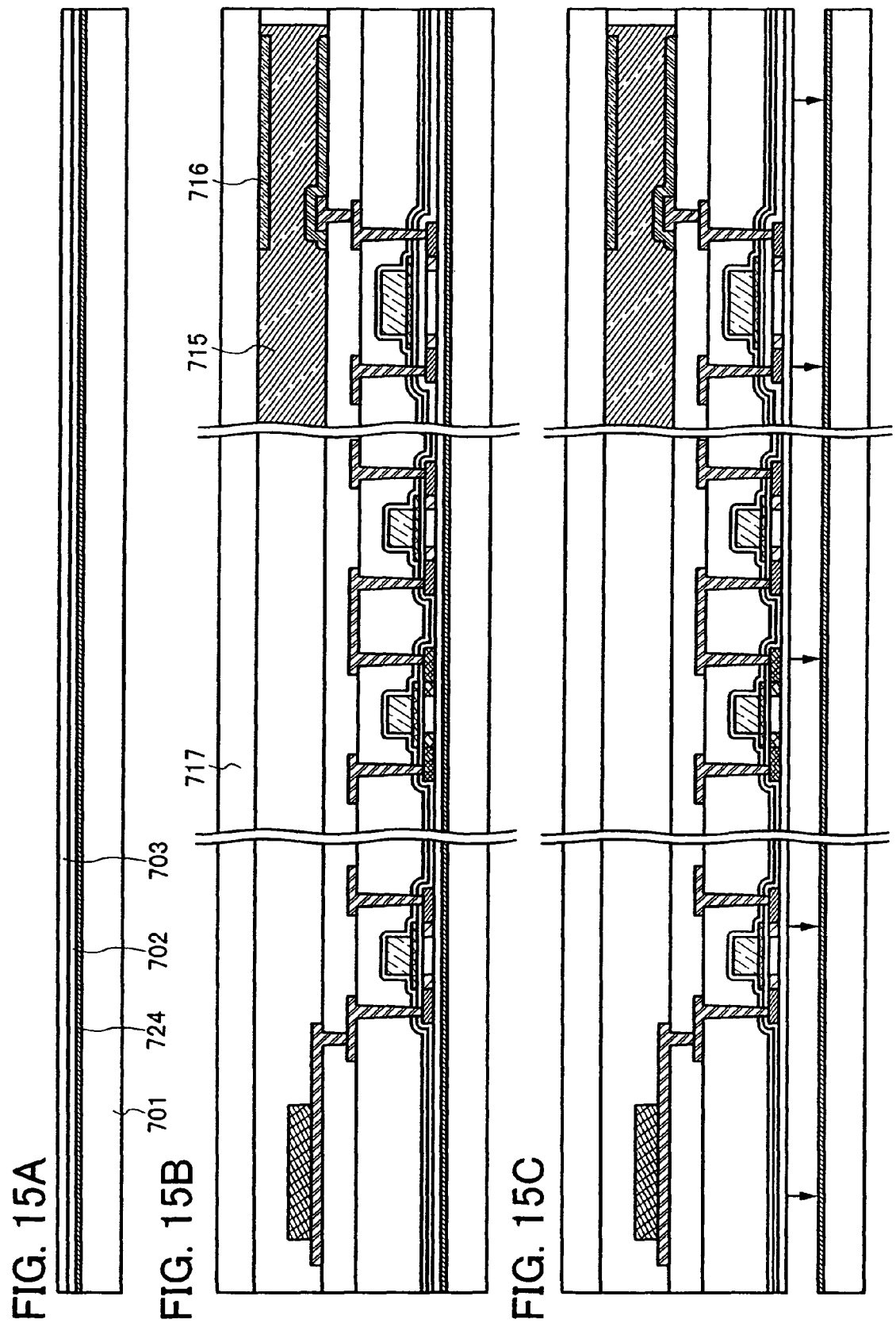
FIGS. 15A to 15C show an example of a manufacturing method of a semiconductor device of the present invention.

A peeling layer 724 is formed on the substrate 701, and the semiconductor film 703 is formed over the peeling layer 724 with the insulating film 702 interposed therebetween (FIG. 15A). Then, as shown in FIGS. 10B to 11C, thin film transistors, a conductive film functioning as an antenna, and a display region can be formed (FIG. 15B).

As the peeling layer 724, a metal film, a multilayer structure of a metal film and a metal oxide film, or the like can be used. The metal film can be formed with a single layer or multilayer of a film formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os) and iridium (Ir), or an alloy material or a compound material containing the above-described element as its main component.

Next, the substrate 701 is peeled off (FIG. 15C). Here, after an opening is formed in a region except the region where the elements such as a thin film transistor are formed, by laser light (e.g., UV light) irradiation, the substrate 701 can be peeled off using physical force. Further alternatively, an etching agent may be introduced into the opening to remove the peeling layer 724, and then peeling may be performed. As the etching agent, a gas or a liquid containing halogen fluoride or an interhalogen compound is used. For example, chlorine trifluoride ($ClF_3$) can be used as the gas containing halogen fluoride. Note that in the case where an etching agent is used, the peeling layer 724 is not necessarily removed entirely, but a part of the peeling layer 724 may be kept remained; this allows consumption of the etching agent to be suppressed and processing time that is required for removing the peeling layer to be shortened. The substrate 701 after being peeled off is preferably reused for cost saving.

Figure 16:
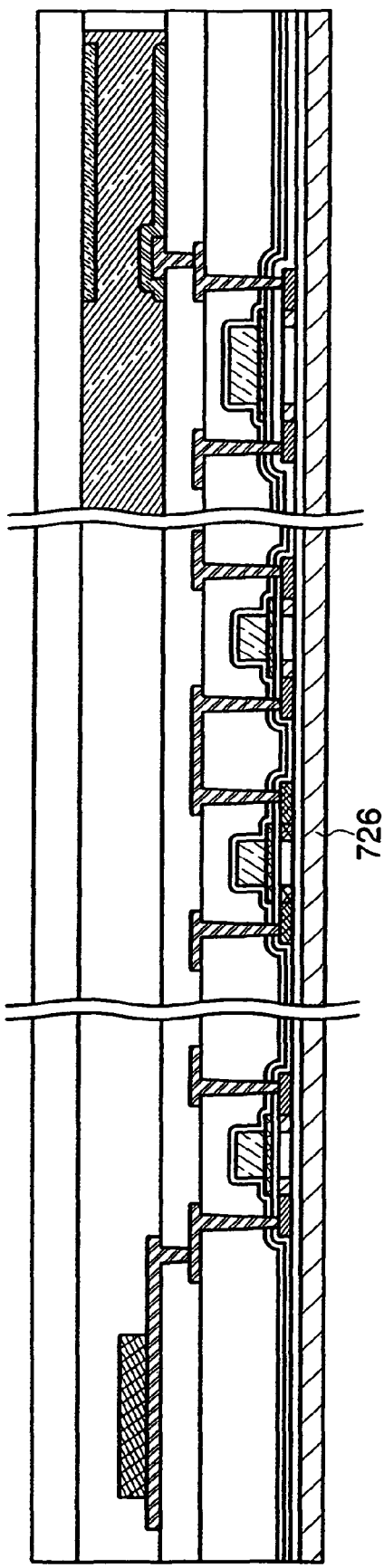
FIG. 16 shows an example of a manufacturing method of a semiconductor device of the present invention.

Next, a substrate 726 having flexibility is attached to a surface from which the substrate 701 has been peeled off (FIG. 16). By using a peeling method in this manner, elements such as a thin film transistor can be provided over a substrate having flexibility. Further, by providing the elements which are to be provided in an integrated circuit and a display portion respectively, at the same time as described above, irregularities of a surface caused by difference in thickness can be reduced.

As the substrate 726, a film which has been subjected to antistatic treatment for preventing static electricity or the like (hereinafter referred to as an antistatic film) may be used as well. An antistatic film includes a film where an antistatic material is dispersed in a resin, a film to which an antistatic material is attached, and the like. The film provided with an antistatic material may be either a film one surface of which is provided with an antistatic material, or a film both surfaces of which are provided with an antistatic material. By using an antistatic film, a semiconductor element such as a thin film transistor can be protected from adverse effects by external static electricity or the like when it is handled as merchandise.

Note that this embodiment mode can be freely combined with the above embodiment modes. In other words, the material or the forming method described in the above embodiment modes can be used in combination with this embodiment mode, and vice versa, the material or the forming method described in this embodiment mode can be used in combination with the above embodiment modes.

Embodiment Mode 4

Figure 13:
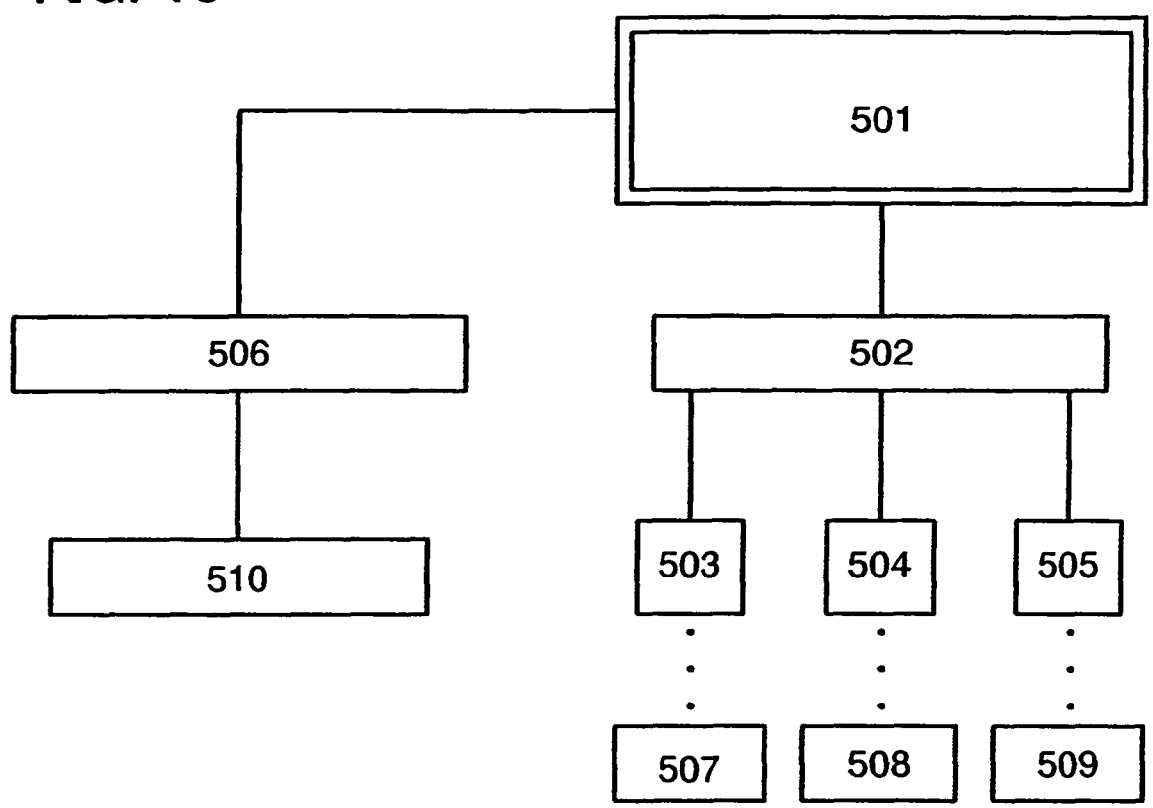
FIG. 13 illustrates a usage pattern of a semiconductor device of the present invention.

Hereinafter, an application example of a semiconductor device capable of wireless identification, which is provided with a display function of the present invention, will be described based on the drawings. Specifically, one example of an electromagnetic wave transmitting source system will be described using FIG. 13.

An electromagnetic wave transmitting source system is constructed from a main server 501 for storing unique data of each holder of the semiconductor device capable of wireless identification, a shop server 502 for supplying data of an integrated circuit included in the semiconductor device, readers/writers (hereinafter each referred to as a "R/W") 503 to 505 for transmitting data to IC cards 507 to 509 respectively, and a Web server 506 for registering or changing unique data.

The main server 501 stores unique data of each holder of the semiconductor device. The shop server 502 is provided in a shop, a security management company, or the like, and exchanges data of an integrated circuit of the semiconductor device with the R/W 503 to 505. Each of the R/W 503 to 505 is provided inside each shop or at a check point which requires security and transmits data in accordance with setting to each IC card 507, 508, or 509 through an electromagnetic wave. The Web server 506 registers or changes unique data of the main server 501 through the Internet or the like.

The Web server 506 can be accessed from a PC 510 or the like through the Internet, thereby unique data can be registered or changed. At this time, a system of inputting an ID number or a password may be employed in order to suppress data leakage.

When the IC card 507, 508, or 509 is put close to the R/W 503, 504, or 505 provided in a shop or at a check point which requires security, the IC card 507, 508, or 509 transmits a unique identification number of an integrated circuit provided in the IC card 507, 508, or 509 to the R/W 503, 504, or 505. When the R/W 503, 504, or 505 identifies the unique identification number of the integrated circuit, the R/W 503, 504, or 505 reads out the unique data of each holder of the integrated circuit or a part thereof which has been stored in the main server 501, in accordance with setting of the shop server 502. Then, the R/W 503, 504, or 505 transmits image data based on the unique data to the IC card 507, 508, or 509, in accordance with the setting of the shop server 502.

Figure 14:
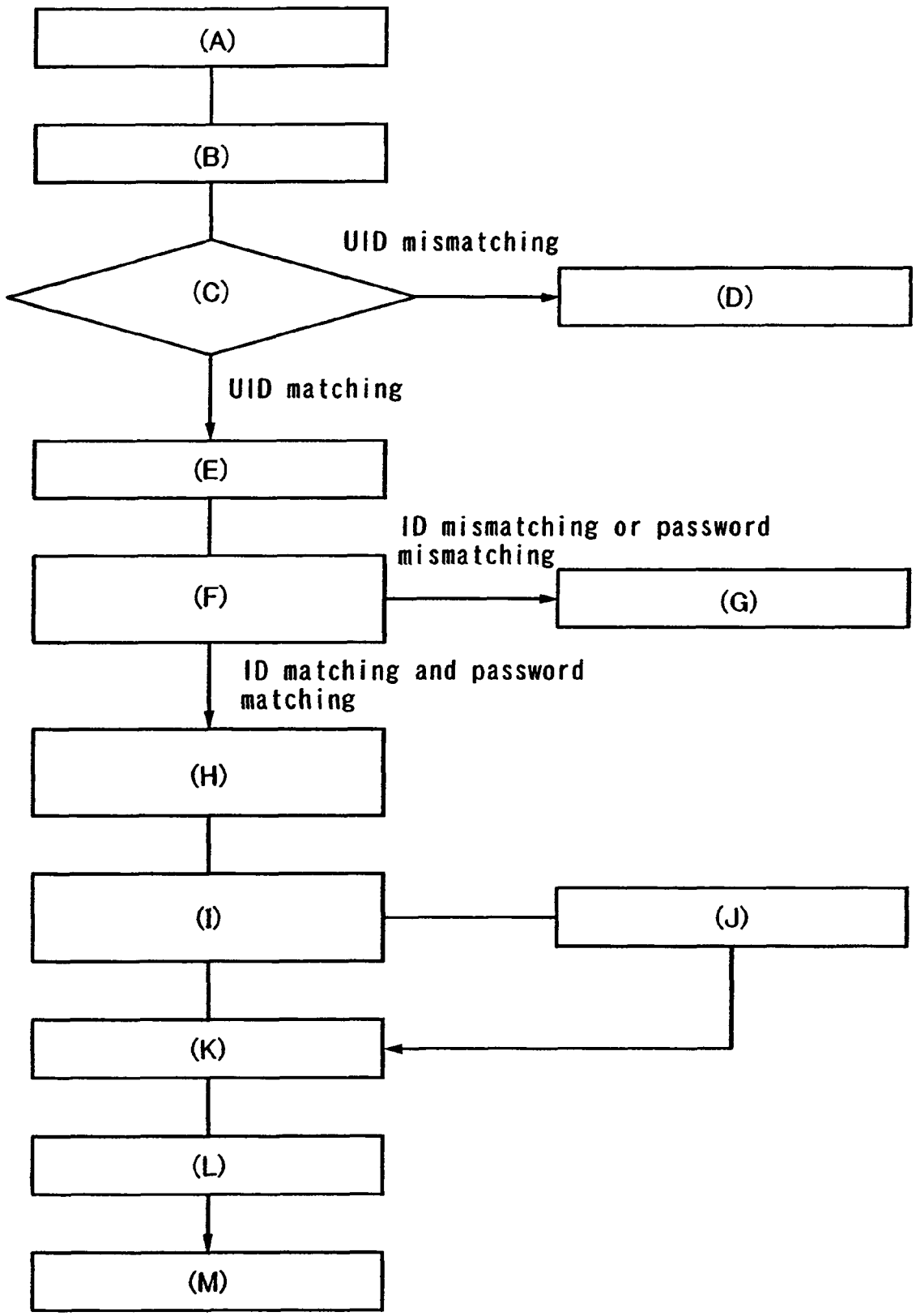
FIG. 14 illustrates a usage pattern of a semiconductor device of the present invention.

An example of the operation of the IC card will be described using a flow chart of FIG. 14.

First, when the IC card is put close to the R/W, electric power for operating the circuit is generated upon reception of electromagnetic wave energy from the R/W (A). At the same time, the R/W transmits a command signal for identifying a unique identification number of an integrated circuit. The circuit of the integrated circuit is operated by receiving the electric power (B).

Next, the integrated circuit analyzes the command signal for identifying a unique identification number of the integrated circuit and returns the unique identification number of an integrated circuit (C). In the case where the unique identification number returned from the IC card has not been registered in the main server, the R/W transmits an error message such as "UNREGISTERED DATA" to the IC card (D).

In the case where the unique identification number returned from the IC card coincides with a unique identification number which has been registered in the main server, unique data of the unique identification number identified by the R/W, or a part thereof is transmitted from the main server to the shop server (E).

In the case where particular high security is required, identification of an ID number or a password which has been registered may also be performed (F). This ID number is not necessarily a unique identification number of an integrated circuit, but may be determined arbitrarily in registering unique data. Similarly, the password can also be determined arbitrarily in registering unique data.

Identification of the ID number or the password is performed with operation of a button provided at the R/W. Besides, various identification methods, such as fingerprint identification or voice identification can be utilized. In the case where at least one of the ID number and the password is different from unique data which has been registered, the R/W transmits an error message such as "INVALID ID NUMBER OR PASSWORD" to the IC card (G). In the case where both of the ID number and the password are correct, unique data which has been transmitted from the main server to the shop server, or a part thereof is transmitted to the R/W provided in the shop (H).

Here, in the case where security is not necessarily required, password identification or the like is not required. In this case, after the identification between a unique identification number and personal data (E), transmission of necessary data to the R/W in the shop (H) may be subsequently performed.

Then, an image/video signal based on the setting of the R/W is transmitted through an electromagnetic wave to the IC card (I). The IC card analyzes the image/video signal transmitted from the R/W and transmits it as visual data to a user (K). In order to narrow down data for displaying, a method in which data to be obtained is selected in accordance with user's preference by displaying a menu screen may also be used (J).

When electric power to be received is reduced by taking the IC card away from the R/W (L), the circuit within the IC card is reset and a series of system terminates (M). It is needless to say that displayed visual data can be retained by using a power source holding capacitor, an auxiliary battery, or the like provided within the circuit or for the IC card.

As a usage example of this IC card, shopping can be given. For example, in the case where we go shopping for an ingredient of dinner in supermarket, the dinner menu is registered in advance through the Internet. The ingredient or the quantity thereof is not necessarily registered at this time, but a system in which each shop supplies data necessary for the menu to a customer is preferably adopted.

For example, when the customer goes to the supermarket and the IC card is put close to the R/W at an entrance, a cooking ingredient and the quantity required for the registered menu are displayed. By using this system, not only useless purchase of the customer can be reduced, but also the shop can perform efficient material supply and merchandise selection since customer's preference can be known.

Further, the IC card can also be applied to a reward card used at each shop. Recently, a reward card has been introduced at many shops. However, different reward cards are adopted depending on a shop, and thus it becomes a burden for customers to carry around with all the reward cards. By utilizing the present invention, since the point data of each IC card is managed by the shop server or the main server, a unique identification number of the IC card is identified by the R/W provided in each shop and the number of accumulated points or the like is displayed. Therefore, a common reward card can be used at a plurality of shops.

As another application example of the semiconductor device provided with a display function, application to a vehicle ticket can be given. A conventional RFID-mounted vehicle ticket which is not provided with a display screen has been required to be checked the remaining amount by a dedicated R/W. The semiconductor device capable of wireless identification, which is provided with a display function, can display the remaining amount on the IC card every time when being passed at a point. Further, by setting a destination in advance, a pathway to the destination may be displayed on a display portion of the IC card.

This application is based on Japanese Patent Application serial no. 2005-376697 filed in Japan Patent Office on 27, Dec., 2005, the entire contents of which are hereby incorporated by reference.

The invention claimed is:

1. A semiconductor device comprising:
  a conductive film functioning as an antenna;
  a power source generating circuit electrically connected to the conductive film functioning as an antenna, the power source generating circuit including a constant voltage circuit and a displaying power source circuit;
  an integrated circuit and a display element electrically connected to the power source generating circuit wherein the constant voltage circuit is configured to supply a first voltage to the integrated circuit and the displaying power source circuit is configured to supply a second voltage to the display element;
  a first thin film transistor provided in the power source generating circuit;
  a second thin film transistor provided in the integrated circuit;
  a third thin film transistor provided in the display element;
  an insulating film provided to cover the first thin film transistor, the second thin film transistor, and the third thin film transistor;
  a source electrode and a drain electrode of the first thin film transistor, a source electrode and a drain electrode of the second thin film transistor, and a source electrode and a drain electrode of the third thin film transistor which are formed over the insulating film; and
  a pixel electrode electrically connected to the source electrode or the drain electrode of the third thin film transistor,
  wherein the source electrode or the drain electrode of the first thin film transistor is electrically connected to the conductive film functioning as an antenna.

2. The semiconductor device according to claim 1, wherein the first thin film transistor, the second thin film transistor, and the third thin film transistor are provided over a same substrate.

3. The semiconductor device according to claim 2, wherein the substrate is a substrate having flexibility.

4. The semiconductor device according to claim 1, wherein the display element includes a display portion provided with a liquid crystal element.

5. The semiconductor device according to claim 1, wherein the display element includes a display portion provided with a light-emitting element.

6. The semiconductor device according to claim 1, wherein the display element includes a display portion provided with an electrophoresis element.

7. The semiconductor device according to claim 1,
  wherein the first thin film transistor includes a first semiconductor film, a first gate insulating film provided over the first semiconductor film, and a first gate electrode provided over the first gate insulating film,
  wherein the second thin film transistor includes a second semiconductor film, a second gate insulating film provided over the second semiconductor film, and a second gate electrode provided over the second gate insulating film,
  wherein the third thin film transistor includes a third semiconductor film, a third gate insulating film provided over the third semiconductor film, and a third gate electrode provided over the third gate insulating film, and
  wherein the third gate insulating film is different in thickness from the first gate insulating film and the second gate insulating film.

8. The semiconductor device according to claim 1 wherein the display element includes a display portion, a gate driver and a source driver.

9. The semiconductor device according to claim 1 wherein the second voltage is higher than the first voltage.

10. The semiconductor device according to claim 1 wherein the integrated circuit has a unique identification number.

11. A semiconductor device comprising:
  an antenna;
  an integrated circuit;
  a display element including a thin film transistor over a substrate;
  a power source generating circuit electrically connected to the antenna, the power source generating circuit including:
    a constant voltage circuit for supplying a first voltage to the integrated circuit; and
    a displaying power source circuit for supplying a second voltage to the display element.

12. The semiconductor device according to claim 11 wherein the display element includes a display portion, a gate driver and a source driver.

13. The semiconductor device according to claim 11 wherein the second voltage is higher than the first voltage.

14. The semiconductor device according to claim 11 wherein the integrated circuit has a unique identification number.

15. The semiconductor device according to claim 11 wherein each of the integrated circuit and the power source generating circuit includes a thin film transistor over the substrate.

16. A semiconductor device comprising:
  an antenna;
  an integrated circuit;
  a display element over a substrate;
  a power source generating circuit electrically connected to the antenna, the power source generating circuit including:
    a constant voltage circuit for supplying a first voltage to the integrated circuit; and
    a displaying power source circuit for supplying a second voltage to the display element.

17. The semiconductor device according to claim 16 wherein the display element includes a display portion, a gate driver and a source driver.

18. The semiconductor device according to claim 16 wherein the second voltage is higher than the first voltage.

19. The semiconductor device according to claim 16 wherein the integrated circuit has a unique identification number.

20. The semiconductor device according to claim 16 wherein each of the integrated circuit and the power source generating circuit includes a thin film transistor over the substrate.

* * * * *

UNITED STATES PATENT AND TRADEMARK OFFICE
CERTIFICATE OF CORRECTION

| | | |
|---|---|---|
| PATENT NO. | : 8,476,632 B2 | Page 1 of 1 |
| APPLICATION NO. | : 11/643941 | |
| DATED | : July 2, 2013 | |
| INVENTOR(S) | : Tokunaga | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1719 days.

Signed and Sealed this
Seventeenth Day of November, 2015

Michelle K. Lee
*Director of the United States Patent and Trademark Office*